(12) United States Patent
Ikeda et al.

(10) Patent No.: US 9,868,884 B2
(45) Date of Patent: Jan. 16, 2018

(54) ADHESIVE COMPOSITION, METHOD FOR MANUFACTURING SEMICONDUCTOR DEVICE USING ADHESIVE COMPOSITION, AND SOLID-STATE IMAGING ELEMENT

(71) Applicant: HITACHI CHEMICAL COMPANY, LTD., Tokyo (JP)

(72) Inventors: Aya Ikeda, Tokyo (JP); Sadaaki Katou, Tokyo (JP); Shinjiro Fujii, Tokyo (JP); Syougo Kikuchi, Tokyo (JP); Shu Hashimoto, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/115,057

(22) PCT Filed: Jan. 29, 2015

(86) PCT No.: PCT/JP2015/052544
§ 371 (c)(1),
(2) Date: Jul. 28, 2016

(87) PCT Pub. No.: WO2015/115553
PCT Pub. Date: Aug. 6, 2015

(65) Prior Publication Data
US 2016/0340561 A1   Nov. 24, 2016

(30) Foreign Application Priority Data
Jan. 29, 2014 (JP) ................. 2014-014861

(51) Int. Cl.
*C09J 133/14* (2006.01)
*C08F 220/18* (2006.01)
(Continued)

(52) U.S. Cl.
CPC ........... *C09J 133/14* (2013.01); *C08F 220/18* (2013.01); *C08F 220/34* (2013.01); *C09J 4/06* (2013.01);
(Continued)

(58) Field of Classification Search
None
See application file for complete search history.

(56) References Cited

U.S. PATENT DOCUMENTS

2001/0044075 A1    11/2001   Nishimura et al.
2007/0257285 A1*   11/2007   Yang ............... H01L 33/502
                                                    257/292
(Continued)

FOREIGN PATENT DOCUMENTS

CN    1930263      3/2007
CN    1954411 A    4/2007
(Continued)

OTHER PUBLICATIONS

International Preliminary Report on Patentability of WO Patent Application No. PCT/JP2015/052544 dated Aug. 11, 2016 in English.
(Continued)

*Primary Examiner* — Bilkis Jahan
(74) *Attorney, Agent, or Firm* — Fitch, Even, Tabin & Flannery LLP

(57) ABSTRACT

An adhesive composition comprising (a) an acrylic polymer having a weight-average molecular weight of 100000 or more, (b) a compound having at least two (meth)acryloyl groups and (c) a polymerization initiator, in which a structural unit having a nitrogen atom-containing group in the (a) acrylic polymer having a weight-average molecular weight of 100000 or more accounts for 5 mass % or less based on the total amount of the (a) acrylic polymer having a weight- (Continued)

average molecular weight of 100000 or more; and the (a) acrylic polymer having a weight-average molecular weight of 100000 or more has a structural unit having a functional group.

15 Claims, 17 Drawing Sheets

(51) Int. Cl.
    *C08F 220/34* (2006.01)
    *C09J 4/06* (2006.01)
    *H01L 23/00* (2006.01)
    *H01L 27/144* (2006.01)
    *H01L 23/29* (2006.01)
    *H01L 27/146* (2006.01)

(52) U.S. Cl.
    CPC ............ *H01L 23/293* (2013.01); *H01L 24/97* (2013.01); *H01L 27/1443* (2013.01); *H01L 27/14618* (2013.01); *H01L 27/14685* (2013.01); *H01L 27/14687* (2013.01); *H01L 2224/32225* (2013.01); *H01L 2224/48091* (2013.01); *H01L 2224/48227* (2013.01); *H01L 2224/73265* (2013.01)

(56) References Cited

U.S. PATENT DOCUMENTS

| | | | | |
|---|---|---|---|---|
| 2009/0026383 | A1* | 1/2009 | Kim | H01L 27/14683 250/370.11 |
| 2010/0165267 | A1* | 7/2010 | Yoshida | G02F 1/13318 349/106 |
| 2011/0140282 | A1* | 6/2011 | Nakano | H01L 23/481 257/774 |
| 2013/0168761 | A1* | 7/2013 | Hsieh | H01L 29/407 257/330 |

FOREIGN PATENT DOCUMENTS

| | | |
|---|---|---|
| CN | 102375340 | 3/2012 |
| CN | 103249791 A | 8/2013 |
| CN | 103257527 | 8/2013 |
| CN | 103992751 A | 8/2014 |
| CN | 105378899 A | 3/2016 |
| JP | 2001-302870 A | 10/2001 |
| JP | 2005-142221 A | 6/2005 |
| JP | 2006-137855 A | 6/2006 |
| JP | 2006-193660 A | 7/2006 |
| JP | 2007-281375 A | 10/2007 |
| JP | 2010-001449 A | 1/2010 |
| JP | 2010-040621 A | 2/2010 |
| JP | 2010-132801 A | 6/2010 |
| JP | 2010-177613 A | 8/2010 |
| JP | 2011-509332 A | 3/2011 |
| JP | 2011-169828 A | 9/2011 |
| JP | 2012-058725 A | 3/2012 |
| JP | 2012-107191 A | 6/2012 |
| JP | 2012-167174 A | 9/2012 |
| JP | 2013-118230 A | 6/2013 |
| JP | 2013-122577 A | 6/2013 |
| JP | 2013-184996 A | 9/2013 |
| WO | 2009/088191 A2 | 7/2009 |
| WO | 2012/077806 A1 | 6/2012 |
| WO | 2013/066597 A1 | 5/2013 |

OTHER PUBLICATIONS

International Preliminary Report on Patentability of WO Patent Application No. PCT/JP2015/052542 dated Aug. 11, 2016 in English.
International Preliminary Report on Patentability of WO Patent Application No. PCT/JP2015/052505 dated Aug. 11, 2016 in English.
International Search Report of WO Patent Application No. PCT/JP2015/052544 dated Apr. 28, 2015 in English.
International Search Report of WO Patent Application No. PCT/JP2015/052542 dated Apr. 28, 2015 in English.
International Search Report of WO Patent Application No. PCT/JP2015/052505 dated Apr. 28, 2015 in English.
Office Action of CN Patent Application No. 201580005738.X dated Mar. 30, 2017.
Office Action of counterpart CN Patent Application No. 201580005756.8 dated Apr. 28, 2017.
Office Action of U.S. Appl. No. 15/114,983, dated Jun. 8, 2017.

* cited by examiner

ADHESIVE COMPOSITION, METHOD FOR MANUFACTURING SEMICONDUCTOR DEVICE USING ADHESIVE COMPOSITION, AND SOLID-STATE IMAGING ELEMENT

TECHNICAL FIELD

The present invention relates to an adhesive composition, a method for manufacturing a semiconductor device using the adhesive composition and a solid-state imaging element.

BACKGROUND ART

Recently, along with the popularization of digital still cameras and camera-equipped cellular phones, low power consumption and miniaturization of solid-state imaging elements have proceeded and CMOS (Complementary Metal Oxide Semiconductor) image sensors have been more and more used other than conventional CCD (Charge Coupled Device) image sensors. These image sensors are each formed of a sensor section (imaging pixel section), in which a plurality of pixels are two-dimensionally arranged in a single semiconductor chip, and a peripheral circuit section arranged outside the sensor section.

As the structure to a CMOS image sensor, a "frontside-illuminated" structure and a "backside-illuminated" structure are known (see, for example, Patent Literatures 1 and 2). In the frontside-illuminated CMOS image sensor of Patent Literature 1, incident light from outside passes through a glass substrate and a cavity and enters each of microlenses. The light beams are converged by the microlenses, pass through a color filter layer and a wiring layer and enter photodiodes. The light incident on the photodiodes is photo-electrically converted to generate signal charges and then electrical signals are produced from signal charges to obtain image data.

In contrast, in the backside-illuminated CMOS image sensor of Patent Literature 2, photodiodes are formed on one of the surface of a semiconductor substrate. On the same surface, a color filter layer and microlenses are arranged. Above the microlenses, a glass substrate is arranged via an adhesive layer and a cavity. On the other surface of the semiconductor substrate, a wiring layer is provided. According to the backside-illuminated structure, since light incident on the microlenses is received by a light receiving section without passing through the wiring layer, attenuation of light by the wiring layer is avoided and the light-receiving sensitivity is enhanced.

As the backside-illuminated CMOS image sensor, a structure, which comprises an adhesive layer formed on a silicon substrate having microlenses and in the outer periphery of the microlenses so as not to cover the microlenses, a low refractive index layer formed in the cavity surrounded by the adhesive layer, and a glass substrate formed via the adhesive layer and the low refractive index layer, is disclosed (see Patent Literature 3).

CITATION LIST

Patent Literature

Patent Literature 1: JP 2007-281375 A
Patent Literature 2: JP 2005-142221 A
Patent Literature 3: JP 2010-40621 A

SUMMARY OF INVENTION

Technical Problem

In the backside-illuminated CMOS image sensor having a cavity as described in, for example, Patent Literature 2, the difference in refractive index between layers is large because a glass substrate usually has a refractive index: nD=about 1.47; air in the cavity portion has a refractive index: nD=about 1.00; and the microlens has a refractive index: nD=about 1.60. Because of this, a problem that incident light is reflected at the interface and a light loss is produced occurs.

Patent Literature 3 discloses a backside-illuminated CMOS image sensor having a structure (non-cavity structure) formed by filling a cavity portion with a low refractive index layer. The low refractive index layer is formed of a low refractive index material having a refractive index of 1.4 or less and can have a large relative refractive index to microlenses. For the reason, this structure is more effective.

However, Patent Literature 3 does not describe occurrence of light loss produced by difference in refractive index of the aforementioned layers. Patent Literature 3 suggests that formation of a cavity may be avoided by forming an adhesive layer consisting of an adhesive having a low-refractive index over the whole surface of a silicon substrate in place of providing the low refractive index layer; however, a material suitable for practical use and having a sufficiently low refractive index and a sufficiently high optical transparency and adhesiveness is not actually found and thus this method is not realistic.

The present invention was made in consideration of such a circumstance and is directed to provide an adhesive composition enabling to constitute an adhesive layer over the whole surface of a semiconductor substrate such as a silicon substrate, by imparting adhesiveness to a transparent resin to be supplied to the cavity portion; and having satisfactory properties as a transparent adhesive, i.e., providing a highly transparent cured product, suppressing warp even if the composition is applied to a thin workpiece (e.g., a wafer reduced in thickness) and providing an excellent peel resistance during a reflow process at 260° C.

Solution to Problem

As a result of intensive studies, the present inventors have found that the aforementioned problems can be overcome by an adhesive composition comprising predetermined components, and accomplished the present invention.

More specifically, the present invention provides an adhesive composition comprising (a) an acrylic polymer having a weight-average molecular weight of 100000 or more, (b) a compound having at least two (meth)acryloyl groups and (c) a polymerization initiator, in which a structural unit having a nitrogen atom-containing group in the (a) acrylic polymer having a weight-average molecular weight of 100000 or more accounts for 5 mass % or less based on the total amount of the (a) acrylic polymer having a weight-average molecular weight of 100000 or more, and the (a) acrylic polymer having a weight-average molecular weight of 100000 or more has a structural unit having a functional group. Such an adhesive composition provides a highly transparent cured product, can suppress warp even if the composition is applied to a thin workpiece (e.g., a wafer reduced in thickness) and provides an excellent peel resistance during a reflow process at 260° C.

The present inventors consider the reasons as follows: cure shrinkage during curing and stress during a reflow process are reduced by adding an acrylic polymer low in elastic modulus to a resin composition comprising a compound having (meth)acryloyl groups. Owing to this, warp at room temperature can be suppressed. In addition, sufficient elastic modulus at 260° C. can be maintained by using an acrylic polymer having a weight-average molecular weight of 100000 or more. Further, if the acrylic polymer contains a structural unit having a functional group, peeling in a reflow process at 260° C. can be suppressed.

An acrylic polymer is a material usually expected to have stress relaxation since it has a rubber elasticity; however, the acrylic polymer is considered to be unsuitable for use in an adhesive for semiconductor devices, manufactured by a process having a reflow step, because the heat-resistance of the acrylic polymer itself is low. However, a reduction in the heat-resistance can be sufficiently suppressed by using an acrylic polymer, which has a weight-average molecular weight of 100000 or more and a structural unit having a functional group in combination with a compound having at least two (meth)acryloyl groups. This is conceivably because a three-dimensional crosslink is formed by the compound having at least two (meth)acryloyl groups so that heat resistance can be improved. In addition, since the compatibility of the (a) acrylic polymer having a weight-average molecular weight of 100000 or more and the compound (b) having at least two (meth)acryloyl groups is high and their refractive indexes are close to each other, a cured product can acquire sufficient transparency to ensure visibility. Because of high compatibility, a phase separation rarely occurs in a varnish state or a semi-cured state and excellent storage stability is ensured. Even if phase separation occurs due to heat after radical curing, it stays in a microscopic phase separation, and properties of cured products such as visibility and adhesive strength are not so much varied. Since a resin composition generally has a larger refractive index than air, if the above cavity portion is filled with a transparent resin, a problem of light loss as mentioned above can be overcome.

Note that, in the resin composition disclosed herein, an acrylic compound can be employed in order for the cured product to obtain a refractive index, nD=about 1.50.

It is preferable that the (a) acrylic polymer having a weight-average molecular weight of 100000 or more contains a structural unit having an alicyclic structure. Owing to the structural unit, the content of an amorphous component increases in an alicyclic structure, with the result that transparency tends to increase. In addition, the glass transition temperature (Tg) thereof is improved compared to that of a structural unit of an aliphatic group having the same number of carbon atoms, with the result that the heat-resistance tends to increase.

It is preferable that the above functional group contains an epoxy group. If an epoxy group such as a glycidyl group is partly contained in the (a) acrylic polymer having a weight-average molecular weight of 100000 or more, a property of adhesion to a substrate of an inorganic material such as a metal and glass can be improved.

It is preferable that the adhesive composition further comprises (d) an antioxidant. Owing to the antioxidant, coloring of the adhesive composition, which is due to deterioration during heating, is suppressed and transparency during heating can be improved.

The present invention also provides the aforementioned adhesive composition for use in optical parts. Since the aforementioned adhesive composition has a larger refractive index than air, provides a highly transparent cured product, suppresses warp of a thin workpiece (for example, a wafer reduced in thickness), to which the composition is applied and provides excellent peel resistance during a reflow process performed at 260° C., the adhesive composition can be used for optical parts and exerts an excellent effect at the time.

The present invention further provides a method for manufacturing a semiconductor device, comprising a step of forming an adhesive layer of the aforementioned adhesive composition on a semiconductor substrate; a step of sandwiching the adhesive layer between the semiconductor substrate and a transparent substrate and applying pressure onto the semiconductor substrate and the transparent substrate for bonding; and a step of curing the adhesive layer. The aforementioned adhesive composition has an excellent function as an adhesive and provides highly transparent cured product. Because of this, an excellent effect can be exerted if the adhesive composition is used in the steps of manufacturing a semiconductor device and the properties of the resultant semiconductor device become satisfactory.

The present invention further provides a solid-state imaging element having a semiconductor substrate having a light receiving section provided on the upper surface, an adhesive layer provided on the semiconductor substrate so as to cover the light receiving section and a transparent substrate bonded to the semiconductor substrate by the adhesive layer, in which the adhesive layer is formed of the aforementioned adhesive composition. Since the solid-state imaging element having such a structure employs the aforementioned adhesive composition, a structure in which an adhesive layer may be provided in the periphery so as not to cover microlenses and the cavity surrounded by the adhesive layer is filled with the adhesive composition may be employed. Other than this structure, a structure in which the adhesive layer formed of the adhesive composition is provided over the whole surface of the substrate can be employed.

Advantageous Effects of Invention

According to the present invention, by imparting adhesiveness to a transparent resin to be supplied to a cavity portion, an adhesive layer can be formed over the whole surface of a semiconductor substrate such as a silicon substrate; at the same time, it is possible to provide an adhesive composition having satisfactory properties as a transparent adhesive, i.e., providing highly transparent cured product, suppressing warp even if the composition is applied to a thin workpiece (e.g., a wafer reduced in thickness) and providing an excellent peel resistance during a reflow process performed at 260° C.

According to the present invention, it is also possible to provide a method for manufacturing a semiconductor device using the aforementioned adhesive composition and a solid-state imaging element formed of the adhesive composition.

DESCRIPTION OF EMBODIMENTS

Figure 1:
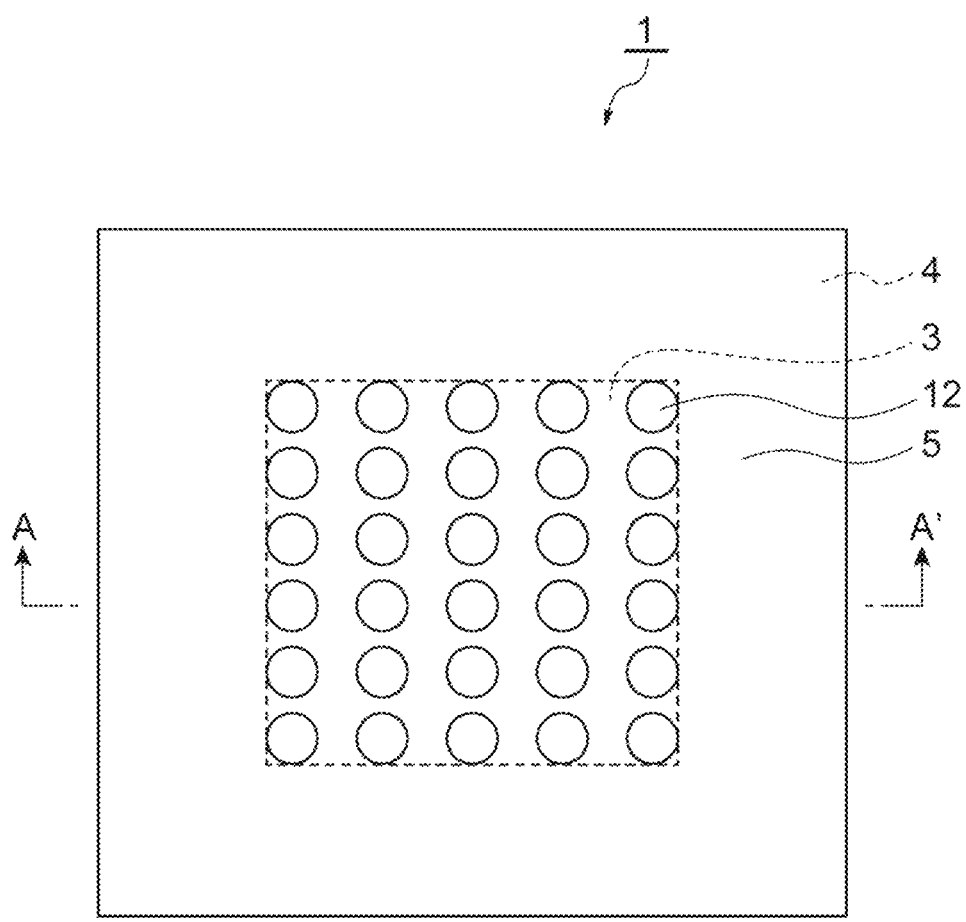
FIG. 1 is a plan view showing a solid-state imaging element according to the embodiment.

Now, preferred embodiments of the present invention will be described below; however, the present invention is not limited to these embodiments. Note that, in the specification, the "(meth)acryloyl group" refers to an "acryloyl group" or a "methacryloyl group" corresponding thereto. The same applies to other analogous expressions such as (meth)acrylate.

In the specification, the "transparency" means that interaction between an adhesive composition and visible light rarely occurs and absorption and scattering of electromagnetic waves rarely occur. As the index of "transparency", transmittance is used, which is the intensity ratio of incident light and transmitted light expressed on percentage. The transmittance varies depending upon the wavelength of target light. In the specification, visible light is targeted. The electromagnetic wave corresponding to the visible light has a lower limit wavelength of about 400 nm and an upper limit wavelength of about 760 nm, according to the definition of JIS Z8120.

In the specification, the term "layer" refers to a layer having a structure formed over a whole surface at planer view; however, a layer structure formed on a part of a surface is also included.

In the specification, the term "step" refers not only to an independent step but also a step which cannot be clearly distinguished from another step but can attain a predetermined purpose of the step is included in the term.

In the specification, the numerical range expressed by using "to" refers to the range including the numeric values before and after "to" as the minimum value and the maximum value, respectively. In the specification, in the numerical ranges described stepwise, the upper or lower limit of the numerical range of a certain step may be replaced with the upper or lower limit of the numerical range of another stage. In the numerical range described in the specification, the upper or lower limit of the numerical range thereof can be replaced with values described in Examples.

<Adhesive Composition>

The adhesive composition according to the embodiment comprises (a) an acrylic polymer having a weight-average molecular weight of 100000 or more, (b) a compound having at least two (meth)acryloyl groups and (c) a polymerization initiator. Note that, in the specification, these components are sometimes simply referred to as a component (a), a component (b), a component (c), etc.

<(a) Acrylic Polymer Having a Weight-Average Molecular Weight of 100000 or More>

The acrylic polymer to be used in the embodiment refers to a polymer constituted of a single acrylic monomer having a single (meth)acryloyl group in a molecule or a copolymer constituted of two types or more acrylic monomers having a single (meth)acryloyl group in a molecule. Note that as long as the effects of the invention are not impaired, a copolymer obtained by copolymerizing a compound which has two or more (meth)acryloyl groups in a molecular or a polymerizable compound having no (meth)acryloyl group (a compound having a single polymerizable unsaturated bond in a molecule, such as acrylonitrile, styrene, vinyl acetate, ethylene, propylene or a compound having two or more polymerizable unsaturated bonds in a molecule, such as divinylbenzene) with an acrylic monomer. In view of this, the acrylic polymer to be used in the embodiment contains an acrylic monomer having a single (meth)acryloyl group in a molecule preferably in an amount of 30 to 100 mass % and more preferably in an amount of 50 to 100 mass % based on the total amount of acrylic polymer.

According to the embodiment, the acrylic polymer having a weight-average molecular weight of 100000 or more contains a structural unit having a functional group. Owing to the content of the structural unit having a functional group, excellent stress relaxation due to low elastic modulus, crack resistance, adhesiveness and heat-resistance can be exerted.

A method for introducing a functional group into an acrylic polymer is not particularly limited; a functional group can be introduced into an acrylic polymer by random copolymerization of a functional group-containing monomer (containing a functional group) by a suspension polymerization such as bead polymerization, granular polymerization and pearl polymerization as well as a conventional method such as solution polymerization, bulk polymerization, precipitation polymerization and emulsion polymerization. Of them, it is preferable to employ a suspension polymerization method for the reason that polymerization can be made at low cost.

The suspension polymerization is carried out in an aqueous solvent by adding a suspension agent. Examples of the suspension agent include water-soluble polymers such as polyvinyl alcohol, methyl cellulose and polyacrylamide and less-soluble inorganic substances such as calcium phosphate and magnesium pyrophosphate. Of them, a non-ionic water-soluble polymer such as polyvinyl alcohol is preferable. This is because when the non-ionic water-soluble polymer is used, ionic impurities are less likely to remain in the resultant acrylic copolymer. It is preferable that the water-soluble polymer is used in an amount of 0.01 to 1 part by mass relative to the total amount 100 parts by mass of the monomers.

In a polymerization reaction, a general polymerization initiator, a general chain transfer agent, etc., may be used. Examples of the polymerization initiator include the same polymerization initiators, which will be mentioned later as the (c) polymerization initiator. Examples of the chain transfer agent include thiols such as n-octyl mercaptan.

It is preferable that the functional group-containing monomer has at least one functional group selected from the group consisting of a carboxyl group, an acid anhydride group, a hydroxyl group, an amino group, an amide group, a phosphate group, a cyano group, a maleimide group and an epoxy group in a molecule, and at least one polymerizable carbon-carbon double bond.

It is preferable that the functional group is at least one group selected from the group consisting of an amino group, an amide group, a phosphate group, a cyano group, a maleimide group and an epoxy group in order to avoid problems such as gelation in a varnish state, clogging of a nozzle, etc., when used and occurrence of pinholes during spin coating. It is preferable that the functional group is at least one group selected from the group consisting of a carboxyl group, an acid anhydride group, a hydroxyl group, a phosphate group and an epoxy group in order to more highly prevent coloring. From both points of view, the functional group is more preferably a phosphate group or an epoxy group and further preferably an epoxy group.

Examples of the functional group-containing monomer that can be used include carboxyl group-containing monomers such as (meth)acrylic acid and itaconic acid; acid anhydride group-containing monomers such as maleic anhydride acid; hydroxyl group-containing monomers such as 2-hydroxymethyl (meth)acrylate, 2-hydroxyethyl (meth)acrylate, 2-hydroxypropyl (meth)acrylate, N-methylol (meth)acrylamide, o-hydroxystyrene, m-hydroxystyrene and p-hydroxystyrene; amino group-containing monomers such as diethylaminoethyl (meth)acrylate; phosphoric acid group-containing monomers such as 2-(meth)acryloyloxyethyl acid phosphate; vinyl cyanide compounds such as (meth)acrylonitrile; N-substituted maleimides such as N-methylmaleimide, N-ethylmaleimide, N-propylmaleimide, N-i-propylmaleimide, N-butylmaleimide, N-i-butylmaleimide, N-t-butylmaleimide, N-laurylmaleimide, N-cyclohexylmaleimide, N-benzylmaleimide and N-phenylmaleimide; and epoxy group-containing monomers such as glycidyl (meth)acrylate, glycidyl α-ethylacrylate, glycidyl α-n-propylacrylate, 3,4-epoxybutyl (meth)acrylate, 4,5-epoxypentyl (meth)acrylate, 6,7-epoxyheptyl (meth)acrylate, 3-methyl-3,4-epoxybutyl (meth)acrylate, 4-methyl-4,5-epoxypentyl (meth)acrylate, 5-methyl-5,6-epoxyhexyl (meth)acrylate, β-methylglycidyl (meth)acrylate and β-methylglycidyl α-ethylacrylate. These can be used alone or in combination of two or more.

Of them, an epoxy group-containing monomer such as glycidyl (meth)acrylate can be particularly preferably used. A polymer obtained by using such a monomer, for example, a glycidyl group-containing (meth)acrylic polymer, is preferable to be compatible with an acrylic monomer or oligomer. The glycidyl group-containing (meth)acrylic polymer may be synthesized by a conventional method or may be a commercially available compound. Examples of the commercially available compound include HTR-860P-3 (trade name, Nagase ChemteX Corporation). Such an acrylic polymer is preferable since more excellent crack resistance, adhesiveness and heat-resistance are exerted and storage stability can be ensured.

The amount of a structural unit having a functional group as mentioned above based on the total amount of an acrylic polymer is preferably 0.5 to 6.0 mass %, more preferably 0.5 to 5.0 mass % and particularly preferably 0.8 to 5.0 mass %. If the amount of a structural unit having a functional group falls within the range, adhesive force can be improved; at the same time, gelation can be suppressed.

According to the embodiment, the acrylic polymer having a weight-average molecular weight of 100000 or more contains a structural unit having a nitrogen atom-containing group in an amount of 5 mass % or less, more preferably 3 mass % or less, further preferably 1 mass % or less based on the whole component (a) and particularly preferably not contain a structural unit having a nitrogen atom-containing group. Examples of the aforementioned nitrogen atom-containing group include an amino group, an amido group, a cyano group and a maleimide group. Examples of the structural unit having a nitrogen atom-containing group include a structural unit derived from a monomer containing a nitrogen atom of the aforementioned functional group-containing monomers, more specifically, a vinyl cyanide compound such as (meth)acrylonitrile.

Examples of the monomers to be used in synthesizing the acrylic polymer according to the embodiment other than the functional group-containing monomers include (meth)acrylic acid esters such as methyl (meth)acrylate, ethyl (meth)acrylate, n-propyl (meth)acrylate, i-propyl (meth)acrylate, n-butyl (meth)acrylate, i-butyl (meth)acrylate, t-butyl (meth)acrylate, pentyl (meth)acrylate, n-hexyl (meth)acrylate, 2-ethylhexyl (meth)acrylate, n-octyl (meth)acrylate, dodecyl (meth)acrylate, octadecyl (meth)acrylate, butoxyethyl (meth)acrylate, phenyl (meth)acrylate, benzyl (meth)acrylate and naphthyl (meth)acrylate; aromatic vinyl compounds such as α-methylstyrene, α-ethylstyrene, α-fluorostyrene, α-chlorostyrene, α-bromostyrene, fluorostyrene, chlorostyrene, bromostyrene, methylstyrene, methoxystyrene and styrene; and alicyclic monomers such as cyclopentyl (meth)acrylate, cyclohexyl (meth)acrylate, methylcyclohexyl (meth)acrylate, trimethylhexyl (meth)acrylate, norbornyl (meth)acrylate, norbornylmethyl (meth)acrylate, phenylnorbornyl (meth)acrylate, isobornyl (meth)acrylate, bornyl (meth)acrylate, menthyl (meth)acrylate, fenchyl (meth)acrylate, adamantyl (meth)acrylate, tricyclo[5.2.1.0$^{2,6}$]deca-8-yl (meth)acrylate, tricyclo[5.2.1.0$^{2,6}$]deca-4-methyl (meth)acrylate and cyclodecyl (meth)acrylate. These can be used alone or in combination of two or more.

The content of each of these monomers other than the functional group-containing monomers is not particularly limited; however, the content is preferably controlled such that Tg of the component (a) to be used in the adhesive composition according to the embodiment falls within the range of −50 to 50° C. For example, if 2.5 mass % of glycidyl methacrylate, 43.5 mass % of methyl methacrylate, 18.5 mass % of ethyl acrylate and 35.5 mass % of butyl acrylate are used as monomers, an epoxy group-containing acrylic polymer having a Tg of 12° C. and a weight-average molecular weight of 100000 or more, serving as the component (a) can be synthesized.

Of the monomers other than the functional group-containing monomers, (meth)acrylic acid esters are preferably used because they easily synthesize a component (a) having a weight-average molecular weight of 100000 or more without gelation. Of the (meth)acrylic acid esters, ethyl (meth)acrylate, butyl (meth)acrylate and 2-ethylhexyl (meth)acrylate are further preferably used because it can be excellently copolymerized with a functional group-containing monomer.

It is preferable that the component (a) contains a structural unit having an alicyclic or heterocyclic structure. Examples of the monomer having an alicyclic or heterocyclic structure for use in producing an acrylic polymer having a structural unit having an alicyclic or heterocyclic structure include the compounds represented by the following formula (1):

[Chemical Formula 1]

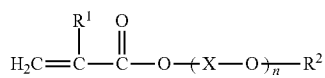

where $R^1$ represents a hydrogen atom or a methyl group; $R^2$ represents an alicyclic group or a heterocyclic group; X represents an alkylene group having 1 to 6 carbon atoms; and n represents an integer of 0 to 10. If n represents an integer of 2 or more, a plurality of X may be mutually the same or different. The alicyclic group herein represents a group having a structure in which carbon atoms are circularly bound; and the heterocyclic group represents a group having a structure in which carbon atoms and 1 or more hetero atoms are circularly bound.

Examples of $R^2$ include the compounds represented by the following formula (2).

[Chemical Formula 2]

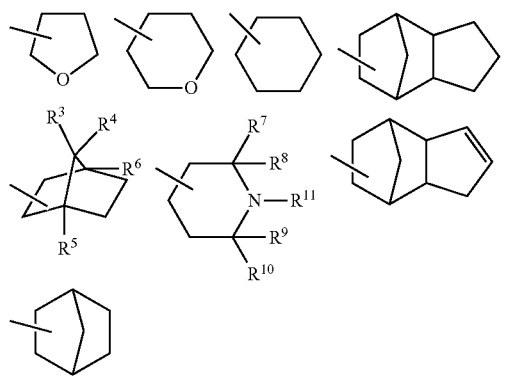

where $R^3$, $R^4$, $R^5$, $R^6$, $R^7$, $R^8$, $R^9$ and $R^{10}$ each independently represent a hydrogen atom or an alkyl group having 1 to 4 carbon atoms; and $R^{11}$ represents a hydrogen atom, an alkyl group having 1 to 4 carbon atoms or a structure represented by $OR^{12}$, in which $R^{12}$ represents a hydrogen atom or an alkyl group having 1 to 8 carbon atoms.

Examples of the compound represented by a formula (1) include cyclohexyl (meth)acrylate, isobornyl (meth)acrylate and tricyclo[5.2.1.0$^{2,6}$]decyl(meth)acrylate.

The content of each of these alicyclic or heterocyclic structure-containing monomers is not particularly limited. For example, if 25.8 mass % of tricyclo[5.2.1.0$^{2,6}$]deca-8-yl acrylate (FA-513A, trade name, manufactured by Hitachi Chemical Co., Ltd.), 20 mass % of butyl acrylate, 31.1 mass % of butyl methacrylate, 18.6 mass % of 2-ethylhexyl methacrylate and 4.5 mass % of glycidyl methacrylate are used, an acrylic polymer having an alicyclic skeleton having a weight-average molecular weight of 100000 or more and containing an epoxy group and serving as a component (a) can be synthesized.

When a functional group-containing monomer is used in combination, the mixing ratio thereof is determined in consideration of Tg of an acrylic polymer. The Tg is preferably −50° C. or more. If Tg is −50° C. or more, the tackiness of the adhesive composition in a B-stage state is appropriate and a problem is rarely produced in handling.

When an acrylic polymer containing a structural unit having a functional group and having a weight-average molecular weight of 100000 or more is produced by polymerizing the aforementioned monomer, a polymerization method thereof is not particularly limited and methods such as pearl polymerization, solution polymerization and suspension polymerization can be used.

The weight-average molecular weight of the acrylic polymer according to the embodiment is preferably 100000 to 3000000 and more preferably 120000 to 2000000. If the weight-average molecular weight falls within the range, when the acrylic polymer is formed into a sheet or film, the sheet or film will have appropriate strength, flexibility and tackiness. In addition, since the polymer has appropriate flowability, it can be sufficiently filled in a wiring circuit. Note that, in the embodiment, the weight-average molecular weight is measured by gel permeation chromatography (GPC) as described in Examples and represented by a value converted based on the standard polystyrene calibration curve.

The use amount of the acrylic polymer component containing a structural unit having a functional group and having a weight-average molecular weight of 100000 or more relative to 100 parts by mass of the following (b) compound having at least two (meth)acryloyl groups is preferably 10 to 400 parts by mass. If the use amount falls within the range, more preferable storage elastic modulus is exhibited, flowability during molding can be suppressed and handling at high temperature can be improved. From these points of view, the use amount is more preferably 15 to 350 parts by mass and particularly preferably 20 to 300 parts by mass.

<(b) Compound Having at Least Two (meth)acryloyl Groups>

Examples of the compound having at least two (meth)acryloyl groups according to the embodiment include, but are not particularly limited to, polyfunctional (meth)acrylic monomers having an alicyclic skeleton, polyfunctional (meth)acrylic monomers having an aliphatic skeleton, polyfunctional (meth)acrylic monomers having a dioxane glycol skeleton and polyfunctional (meth)acrylic monomer having a functional group. Note that, the term "polyfunctional" herein is used for a (meth)acryloyl group, and means that at least two or more (meth)acryloyl groups are present in a compound.

In order to improve the transparency of a cured product, a polyfunctional (meth)acrylic monomer having an alicyclic skeleton and a polyfunctional (meth)acrylic monomer having a dioxane glycol skeleton are preferable. In contrast, in order to more effectively suppress a crack of a cured product and peeling thereof from a base material, it is preferable to use a polyfunctional (meth)acrylic monomer having an aliphatic skeleton.

Examples of the polyfunctional (meth)acrylic monomer include the following (meth)acrylic monomers having two (meth)acryloyl groups.

Examples of the (meth)acrylic monomer having two (meth)acryloyl groups include cyclohexane-1,4-dimethanol di(meth)acrylate, cyclohexane-1,3-dimethanol di(meth)acrylate, tricyclodecanedimethylol di(meth)acrylate (for example, KAYARAD R-684: tricyclodecanedimethylol diacrylate, Nippon Kayaku Co., Ltd.), tricyclodecanedimethanol di(meth)acrylate (for example, A-DCP: tricyclodecanedimethanol diacrylate, SHIN-NAKAMURA CHEMICAL CO., LTD.), dioxane glycol di(meth)acrylate (for example, KAYARAD R-604: dioxane glycol diacrylate, Nippon Kayaku Co., Ltd.; and A-DOG: dioxane glycol diacrylate, Shin-Nakamura Chemical Co., Ltd.), neopentyl glycol di(meth)acrylate, dicyclopentanyl di(meth)acrylate, 1,6-hexanediol di(meth)acrylate, ethylene oxide-modified 1,6-hexanediol di(meth)acrylate, neopentyl glycol di(meth) acrylate, (poly)ethylene oxide-modified neopentyl glycol di(meth)acrylate, hydroxypivalic acid neopentyl glycol di(meth)acrylate, polyethylene glycol di(meth)acrylate, polypropylene glycol di(meth)acrylate, ethylene oxide-modified bisphenol A di(meth)acrylate (preferably polyethylene oxide-modified bisphenol A di(meth)acrylate, more preferably ethylene oxide (5 to 15 mol)-modified bisphenol A di(meth)acrylate), and (poly)ethylene oxide-modified phosphoric acid di(meth)acrylate.

Of them, in order to improve the transparency of a cured product, dioxane glycol diacrylate or tricyclodecanedimethanol diacrylate is more preferable.

Examples of the polyfunctional (meth)acrylic monomer may include (meth)acrylic monomers having three (meth) acryloyl groups, such as pentaerythritol tri(meth)acrylate, ethylene oxide-modified isocyanuric acid tri(meth)acrylate. Note that, the adhesive composition according to the embodiment may comprise a monofunctional (meth)acrylic monomer other than the component (b). Examples of the monofunctional (meth)acrylic monomer include the acrylic monomers mentioned in the above section of component (a).

<(c) Polymerization Initiator>

As the (c) polymerization initiator according to the embodiment, for example, either one or both of (c1) a thermal polymerization initiator and (c2) a photopolymerization initiator can be used. Since the curing reaction of the adhesive composition according to the embodiment proceeds more uniformly and the adhesive strength thereof is further improved, it is more preferable to comprise (c1) a thermal polymerization initiator.

Examples of the (c1) thermal polymerization initiator include organic peroxides such as t-hexyl peroxypivalate (PERHEXYL PV, trade name; one hour half-life temperature 71.3° C., 10 hours half-life temperature 53.2° C.), dilauroyl peroxide (PERHEXYL L, trade name; one hour half-life temperature 79.3° C., 10 hours half-life temperature 61.6° C.), di(3,5,5-trimethylhexanoyl)peroxide (PERLOYL 355, trade name; one hour half-life temperature 76.8° C., 10 hours half-life temperature 59.4° C.), 1,1,3,3-tetramethylbutylperoxy-2-ethyl hexanoate (PEROCTA O, trade name; one hour half-life temperature 84.4° C., 10 hours half-life temperature 65.3° C.), t-butylperoxy-2-ethyl hexanoate (PERBUTYL O, trade name; one hour half-life temperature 92.1° C., 10 hours half-life temperature 72.1° C.), benzoyl peroxide+water (NYPER BW, trade name; one hour half-life temperature 92.0° C., 10 hours half-life temperature 73.6° C.), 1,1-di(t-hexylperoxy)-3,3,5-trimethylcyclohexane (PERHEXA TMH, trade name; one hour half-life temperature 106.4° C., 10 hours half-life temperature 86.7° C.), 1,1-di(t-hexylperoxy)cyclohexane (PERHEXA HC, trade name; one hour half-life temperature 107.3° C., 10 hours half-life temperature 87.1° C.), t-hexylperoxyisopropyl monocarbonate (PERHEXYL I, trade name; one hour half-life temperature 114.6° C., 10 hours half-life temperature 95.0° C.), t-butylperoxyisopropyl monocarbonate (PERBUTYL I, trade name; one hour half-life temperature 118.4° C., 10 hours half-life temperature 98.7° C.), dicumyl peroxide (PERCUMYL D, trade name; one hour half-life temperature 135.7° C., 10 hours half-life temperature 116.4° C.), and n-butyl 4,4-bis(t-butylperoxy) valerate (PERHEXA V trade name; one hour half-life temperature 126.5° C., 10 hours half-life temperature 104.5° C.); and azo compounds such as 2,2'-azobisisobutyronitrile, 1,1'-(cyclohexane-1,1-carbonitrile)-2,2'-azobis(2-cyclopropylpropionitrile) and 2,2'-azobis(2,4-dimethylvaleronitrile).

These thermal polymerization initiators can be used alone or in combination of two or more.

Of these thermal polymerization initiators, an organic peroxide is preferable since the effect of improving the physical properties of a cured product is larger; and an organic peroxide having a 10 hours half-life temperature of 90 to 150° C. is more preferable since the balance between handling such as shelf life and pot life of the adhesive composition and curing is more satisfactorily maintained.

The blending amount of the component (c1) relative to 100 parts by mass of the total amount of the component (a) and the component (b) is preferably 0.1 to 30 parts by mass, more preferably 0.2 to 20 parts by mass and further preferably 0.5 to 10 parts by mass.

Note that the half-life temperature of an organic peroxide is measured as follows.

An organic peroxide solution, which is prepared so as to have a concentration of 0.1 mol/L with benzene used as a solvent, is sealed in a glass tube purged with nitrogen. The glass tube is soaked in a thermostatic bath set at a predetermined temperature to carry out thermal decomposition. Generally, decomposition of an organic peroxide in a diluted solution can be approximately treated as a primary reaction. Thus, assuming that the amount of decomposed organic peroxide is represented by $x$(mol/L), the decomposition rate constant by k (1/h), time by t (h) and the initial organic peroxide concentration by a (mol/L), the following formula (1) and formula (2) are established.

$$dx/dt=k(a-x) \quad (1)$$

$$\ln\{a/(a-x)\}=kt \quad (2)$$

Since the half-life is a time period required until the initial concentration of organic peroxide to be decomposed is reduced by half, the half-life is represented by t1/2 and x of formula (2) is substituted by a/2, the following formula (3) is obtained.

$$kt1/2=\ln 2 \quad (3)$$

Accordingly, if the thermal decomposition is carried out at a constant temperature; time (t) and value of $\ln\{a/(a-x)\}$ are plotted to obtain a linear line showing a relationship between them; and a value k is obtained from the inclination of the line, the half-life (t1/2) at the temperature can be obtained in accordance with formula (3).

On the other hand, as to the decomposition rate constant k, provided that the frequency factor is represented by A (1/h), the activation energy by E (J/mol), the gas constant by R (8.314J/mol·K) and the absolute temperature by T (K), the following formula (4) is established.

$$\ln k=\ln A-\Delta E/RT \quad (4)$$

From formula (3) and formula (4), k is deleted to obtain the following formula (5):

$$\ln(t1/2)=\Delta E/RT-\ln(A/2) \quad (5)$$

Herein, t1/2 is obtained with respect to several temperature values. Values of ln (t1/2) and 1/T are plotted to obtain a linear line showing the relationship of them. From the linear line, temperature (one hour half-life temperature) at t1/2=1h can be obtained. Similarly, 10 hours half-life temperature can be obtained assuming that t1/2=10h.

Examples of a preferable organic peroxide of the thermal polymerization initiators mentioned above include dicumyl peroxide (PERCUMYL D) and n-butyl 4,4-bis(t-butylperoxy)valerate (Perhexa V).

Note that a thermal polymerization initiator, if it is used in combination with the component (a) and the component (b), exhibits excellent heat-resistance, peeling resistance and stress relaxation and improves the reliability of optical parts.

Examples of the (c2) photopolymerization initiator include acylphosphine oxides, oxime esters, aromatic ketones, quinones, benzoin ether compounds, benzyl derivatives, 2,4,5-triarylimidazole dimers, acridine derivatives, coumarin compounds and N-phenylglycine derivatives. Note that, the (c2) photopolymerization initiator to be used in the embodiment may be synthesized by a conventional method or may be a commercially available compound.

Of these, in consideration of improvement of photo-crosslinking, sensitivity and the transparency of the cured film, acylphosphine oxides and oxime esters are preferable.

Note that the (c2) photopolymerization initiators can be used alone or in combination of two or more.

Examples of the acylphosphine oxides include bis(2,4,6-trimethylbenzoyl)-phenylphosphine oxide (trade name: IRGACURE-819, BASF) and 2,4,6-trimethylbenzoyl-di-phenylphosphine oxide (trade name: LUCIRIN TPO, BASF).

Examples of the oxime esters include 1,2-octanedione-1-[4-(phenylthio)phenyl-2-(O-benzoyloxime)] (trade name: IRGACURE-OXE01, BASF), 1-[9-ethyl-6-(2-methylbenzoyl)-9H-carbazol-3-yl]ethanone-1-(O-acetyl oxime) (trade name: IRGACURE-OXE02, BASF) and 1-phenyl-1,2-propanedione-2-[o-(ethoxycarbonyl)oxime] (trade name: Quantacure-PDO, Nippon Kayaku Co., Ltd.).

Examples of the aromatic ketones include, benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2,2-dimethoxy-1,2-diphenylethan-1-one (trade name: IRGACURE-651, BASF) 2-benzyl-2-dimethylamino-1-(4-morpholino-phenyl)-butan-1-one (trade name: IRGACURE-369, BASF), 2-methyl-1-[4-(methylthio)phenyl]-2-morpholino-propan-1-one (trade name: IRGACURE-907, BASF) and 2-hydroxy-1-{4-[4-(2-hydroxy-2-methyl-propionyl)-benzyl] phenyl}-2-methyl-propan-1-one (trade name: IRGA-CURE-127, BASF).

Examples of the quinones include 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone and 2,3-dimethylanthraquinone.

Examples of the benzoin ether compounds include benzoin methyl ether, benzoin ethyl ether and benzoin phenyl ether.

Examples of the benzyl derivatives include benzoin compounds such as benzoin, methyl benzoin and ethyl benzoin; and benzyldimethylketal.

Examples of the 2,4,5-triarylimidazole dimers include 2-(o-chlorophenyl)-4,5-diphenylimidazole dimer, 2-(o-chlorophenyl)-4,5-di(methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer. Examples of the 2-(o-chlorophenyl)-4,5-diphenylimidazole dimer include 2-(2-chlorophenyl)-1-[2-(2-chlorophenyl)-4,5-diphenyl-1,3-diazol-2-yl]-4,5-diphenylimidazole.

Examples of the acridine derivatives include 9-phenyl acridine and 1,7-bis(9,9'-acridinyl)heptane.

Examples of the coumarin compounds include 7-amino-4-methylcoumarin, 7-dimethylamino-4-methylcoumarin, 7-diethylamino-4-methylcoumarin, 7-methylamino-4-methylcoumarin, 7-ethylamino-4-methylcoumarin, 7-dimethylamino cyclopenta[c]coumarin, 7-aminocyclopenta[c]coumarin, 7-diethylaminocyclopenta[c]coumarin, 4,6-dimethyl-7-ethylaminocoumarin, 4,6-diethyl-7-ethylaminocoumarin, 4,6-dimethyl-7-diethylaminocoumarin, 4,6-dimethyl-7-dimethylaminocoumarin, 4,6-diethyl-7-ethylaminocoumarin, 4,6-diethyl-7-dimethylaminocoumarin, 2,3,6,7,10,11-hexanehydro-1H,5H-cyclopenta[3,4][1]benzopyrano-[6,7,8-ij]quinolizine 12 (9H)-on, 7-diethylamino-5',7'-dimethoxy-3,3'-carbonyl bis-coumarin, 3,3'-carbonylbis[7-(diethylamino)coumarin] and 7-diethylamino-3-thienoxylcoumarine.

Examples of N-phenylglycine derivatives include N-phenylglycine, N-phenylglycine butyl ester, N-p-methylphenylglycine, N-p-methylphenylglycine methyl ester, N-(2,4-dimethylphenyl)glycine and N-methoxyphenyl glycine.

The blending amount of the (c2) photopolymerization initiator relative to 100 parts by mass of the total amount of the component (a) and the component (b) is preferably 0.1 to 20 parts by mass, more preferably 0.5 to 10 parts by mass and further preferably 0.75 to 5 parts by mass. If the blending amount falls within the aforementioned range, foaming, turbidity, coloring and crack of the cured product can be more highly prevented.

<Organic Solvent>

The adhesive composition according to the embodiment is prepared in a state like vanish by dissolving or dispersing other than components (a), (b), and (c), and, if necessary, an optional component(s) (described later) in an organic solvent. In this manner, the coating properties of the adhesive composition to a base material are improved, thereby improving workability.

The organic solvent to be used for obtaining a state like a varnish is not limited as long as the components of the adhesive composition are homogeneously stirred, mixed, melted, kneaded or dispersed, and solvents known in the art can be used. Examples of the organic solvent to be used, include, are not particularly limited to, alcohols, ethers, ketones, amides, aromatic hydrocarbons, esters and nitriles. More specifically, in consideration of volatility at low temperatures, low-boiling point solvents may be mentioned, which include diethyl ether, acetone, methanol, tetrahydrofuran, hexane, ethyl acetate, ethanol, methyl ethyl ketone and 2-propanol. In order to improve stability of a coating film, etc., high-boiling point solvents may be mentioned, which include toluene, methyl isobutyl ketone, 1-butanol, 2-methoxyethanol, 2-ethoxyethanol, xylene, N,N-dimethylacetamide, N,N-dimethylformamide, cyclohexanone, dimethyl acetamide, butyl cellosolve, dimethyl sulfoxide, propylene glycol monomethyl ether acetate, N-methyl-2-pyrrolidone and γ-butyrolactone. These organic solvents can be used alone or in combination of two or more.

Of these, methyl ethyl ketone, cyclohexanone, etc., are preferably used since they have an excellent solubility and a high drying rate.

The amount of organic solvent to be used in the adhesive composition according to the embodiment is determined by viscosity, etc., of a mixture like a vanish. The amount of organic solvent, which is not particularly limited, is preferably falls within the range of about 5 to 95 mass %, and more preferably 10 to 90 mass % relative to the whole adhesive composition.

<(d) Antioxidant>

To the adhesive composition according to the embodiment, if necessary, an antioxidant can be added. Examples of the antioxidant to be used in the embodiment include a phenolic antioxidant and a thioether antioxidant.

It is preferable that the amount of antioxidant to be used in the adhesive composition according to the embodiment relative to 100 parts by mass of the total amount of components (a), (b) and (c) is 0.01 to 10 parts by mass.

<Coupling Agent>

To the adhesive composition according to the embodiment, a coupling agent can be added. Examples of the coupling agent to be used include, but are not particularly limited to, various coupling agents such as a silane coupling agent, a titanate coupling agent, an aluminum coupling agent, a zirconate coupling agent and a zircoaluminate coupling agent.

Examples of the silane coupling agent include methyltrimethoxysilane, methyltriethoxysilane, phenyltrimethoxysilane, phenyltriethoxysilane, vinyltrimethoxysilane, vinyltriethoxysilane, vinyltriacetoxysilane, vinyl-tris(2-methoxyethoxy)silane, γ-methacryloxytrimethoxysilane, γ-methacryloxypropylmethyl dimethoxysilane, methyltri(methacryloxyethoxy)silane, γ-acryloxypropyltrimethoxysilane, γ-aminopropyltrimethoxysilane, γ-aminopropyltriethoxysilane, N-β-(aminoethyl)-γ-aminopropyltrimethoxysilane, N-β-(aminoethyl)-γ-aminopropylmethyldimethoxysilane, N-β-(N-vinylbenzylaminoethyl)-γ-aminopropyltrimethoxysilane, γ-anilinopropyltrimethoxysilane, γ-ureidopropyltrimethoxysilane, γ-ureidopropyltriethoxysilane, 3-(4,5-dihydroimidazolyl)propyltriethoxysilane, β-(3,4-epoxycyclohexyl)ethyltrimethoxysilane, γ-glycidoxypropyltrimethoxysilane, γ-glycidoxypropylmethyldiethoxysilane, γ-glycidoxypropylmethyldiisopropenoxysilane, methyltriglycidoxysilane, γ-mercaptopropyltrimethoxysilane, γ-mercaptopropyltriethoxysilane, γ-mercaptopropylmethyldimethoxysilane, trimethylsilylisocyanate, dimethylsilylisocyanate, phenylsilyltriisocyanate, tetraisocyanatesilane, methylsilyltriisocyanate, vinylsilyltriisocyanate and ethoxysilanetriisocyanate.

Examples of the titanate coupling agent include isopropyltriisostearoyl titanate, isopropyltridodecylbenzenesulfonyl titanate, isopropyltris(dioctylpyrophosphate) titanate, tetraisopropylbis(dioctylphosphite) titanate, tetraoctylbis(ditridecylphosphite) titanate, tetra(2,2-diallyloxymethyl-1-butyl)bis(ditridecyl)phosphite titanate, bis(dioctylpyrophosphate)oxyacetate titanate, bis(dioctylpyrophosphate) ethylene titanate, isopropyltrioctanoyl titanate, isopropyldimethacrylisostearoyl titanate, isopropyl(dioctylphosphate) titanate, isopropyltricumylphenyl titanate, isopropyltri(N-aminoethylaminoethyl) titanate, dicumylphenyloxyacetate titanate and diisostearoylethylene titanate.

Examples of the aluminum coupling agents include acetoalkoxyaluminum diisopropionate.

Examples of the zirconate coupling agents include tetrapropyl zirconate, tetrabutyl zirconate, tetra(triethanolamine) zirconate, tetraisopropyl zirconate, zirconium acetylacetonateacetylacetonezirconium butyrate, and stearic acid zirconium butyrate.

Examples of the zircoaluminate coupling agent include the compounds represented by the following formula (3):

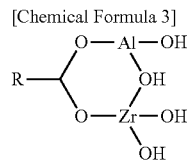

[Chemical Formula 3] (3)

where R represents a carboxyl group or an amino group.

Examples of the compound where R represents a carboxyl group include Manchem CPG-carboxy zircoaluminate. Examples of the compound where R represents an amino group include a Manchem APO-X-amino zircoaluminate solution. They are each available from Rhone-Poulenc Inc.

The blending amount of the coupling agent relative to 100 parts by mass of the total amount of components (a), (b) and (c) is preferably 0.1 to 20 parts by mass and particularly preferably 1 to 15 parts by mass. If the blending proportion is 0.1 part by mass or more, adhesive strength tends to improve. In contrast, if the blending proportion is 20 parts by mass or less, the content of a volatile matter is lower and voids tend to be rarely formed in the cured product.

Among these coupling agents, it is preferable to select a silane coupling agent since it is effective in improving coupling of materials at the interface or wettability.

<Filler>

To the adhesive composition according to the embodiment, if necessary, a filler may be added. Types of fillers include an inorganic filler, an organic filler, etc. In order to improve heat-resistant or thermal conductivity, or control melt viscosity or provide thixotropy, an inorganic filler is preferable.

Examples of the inorganic filler include, but are not particularly limited to, aluminum hydroxide, magnesium hydroxide, calcium carbonate, magnesium carbonate, calcium silicate, magnesium silicate, calcium oxide, magnesium oxide, aluminum oxide, aluminum nitride, titanium oxide, zirconium oxide, cerium oxide, zinc oxide, aluminum borate whisker, boron nitride, crystalline silica, amorphous silica and antimony oxide. These can be used alone or in combination of two or more.

In order to improve thermal conductivity, aluminum oxide, aluminum nitride, boron nitride, crystalline silica, amorphous silica, etc., are preferable. To control melt viscosity or provide thixotropy, aluminum hydroxide, magnesium hydroxide, calcium carbonate, magnesium carbonate, calcium silicate, magnesium silicate, calcium oxide, magnesium oxide, aluminum oxide, crystalline silica, amorphous silica, etc., are preferable.

In order to improve transparency and workability, it is preferable that the blending amount of filler is 3 mass % or less of the total adhesive composition excluding a solvent.

When a varnish is produced by adding a filler to the adhesive composition according to the embodiment, the vanish is sufficiently dispersed by applying physical shearing force by a means such as a grinder, 3-rolls, a ball mill and a bead mill so as not to remain secondary agglomerated particles, and then put in use. The aforementioned dispersion methods can be used in combination.

The duration of mixing components can be reduced by previously mixing a filler and a low molecular weight substance(s) and then adding a high molecular weight substance(s) to the mixture.

Example of a method of homogeneously stirring and mixing individual components include, but are not particularly limited to, a method of using a rotation revolution stirrer such as a dissolver, a static mixer, a homogenizer, an ultrasonic homogenizer, a paint shaker, a ball mill, a planetary mixer, a mixing rotor and a universal agitator, and a method of using a kneader such as a stone-mill and 3-rolls. These methods can be appropriately used in combination. After a mixture is obtained in a state like a varnish, it is preferable to remove air bubbles in the vanish-like mixture. In view of this, the rotation revolution stirrer, which simultaneously carries out mixing, dissolution and removal of air bubbles, is preferably employed.

To the adhesive composition according to the embodiment, if necessary, further a hygroscopic agent such as calcium oxide and magnesium oxide; a wettability improving agent such as a fluorine-containing surfactant, a nonionic surfactant and a higher fatty acid; a defoamer such as a silicone oil; and an ion trapping agent such as an inorganic ion exchanger may be appropriately added alone or in combination of several types of agents.

Note that the content of nitrogen is preferably 8 mass % or less, and more preferably 5 mass % or less based on the whole adhesive composition according to the embodiment, excluding a solvent. It is preferable that the content of nitrogen falls within the range, because coloring due to nitrogen oxide can be highly suppressed.

<Method for Manufacturing a Semiconductor Device>

The method for manufacturing a semiconductor device according to the embodiment, comprises a step of forming an adhesive layer (hereinafter referred to also as "adhesive resin layer") of the aforementioned adhesive composition according to the embodiment on a semiconductor substrate (adhesive layer formation step); a step of sandwiching the adhesive layer between the semiconductor substrate and a transparent substrate and applying pressure onto the semiconductor substrate and the transparent substrate for bonding (press-bonding step); and a step of curing the adhesive layer (curing step).

(Adhesive Layer Formation Step)

For the adhesive layer formation step, a method of applying the adhesive composition according to the embodiment onto a semiconductor substrate or a method of attaching an adhesive composition in a film form to a semiconductor substrate can be employed. The semiconductor substrate is either one of a semiconductor wafer and a semiconductor device (semiconductor chip).

As the method of applying the adhesive composition, a dispensing method, a spin coating method, die coating method, a knife coating method, etc., may be mentioned. In particular, a spin coat method or a die coating method, which is suitable for application of the composition comprising a high molecular weight compound is preferable.

When the method of attaching an adhesive composition in a film form is employed, in order to ensure sufficient wetting and spreading thereof, it is preferable to laminate the adhesive composition in a film form within the range of 0 to 90° C. To uniformly bond the adhesive composition in a film form, it is preferable to employ lamination by use of a roll.

A method of producing an adhesive composition in a film form will be described below. The adhesive composition according to the embodiment is uniformly applied to a support film and heated in the conditions in which the solvent used herein is sufficiently volatilized, for example, at a temperature of 60 to 200° C. for 0.1 to 30 minutes, to form the adhesive composition in a film form. At this time, in order to obtain an adhesive composition in a film form having a desired thickness, the amount of solvent in the adhesive composition, viscosity thereof, the initial thickness of the coating (when a coater such as a die coater and a comma coater is used, the gap between the coater and a support film is controlled), drying temperature, air flow, etc., are controlled.

It is preferable that the support film is flat. Since a support film such as a PET film has highly adhesive due to static attraction, a smoothing agent is sometimes used in order to improve workability. Depending upon the type of smoothing agent and temperature, minor projections and depressions are transferred to the adhesive and the degree of flatness may sometimes decrease. Accordingly, it is preferable to use a support film to which a smoothing agent is not applied or a support film having a low amount of smoothing agent applied. A support film such as a polyethylene film is preferable in view of excellent flexibility; however, the thickness and density of the support film is appropriately selected such that marks of a roll, etc., used in lamination are not transferred to the surface of a light sensitive adhesive layer.

(Press-bonding Step)

In the next step, the adhesive layer formed on the semiconductor substrate, if desired, heated and dried. The drying temperature is not particularly limited. If components are dissolved or dispersed in a solvent to prepare a mixture like a varnish, it is preferable that the drying temperature is lower by 10 to 50° C. than the boiling point of the solvent used herein. This is preferable because the solvent is not bubbled during drying and air bubbles are not formed. For the reason, the drying temperature is lower more preferably by 15 to 45° C. and further preferably by 20 to 40° C. than the boiling point of the solvent to be used.

In the case where components are dissolved or dispersed in a solvent to prepare a mixture like varnish, it is particularly preferable that the remaining amount of solvent is reduced as much as possible because formation of air bubbles due to bubbling of the solvent after curing is avoided.

The duration of heat-drying is not particularly limited as long as the solvent used there is sufficiently volatilized and the component (c) does not substantially generate radicals. The heat-drying is usually performed by heating at 40 to 100° C. for 0.1 to 90 minutes. Note that, the phrase "does not substantially generate radicals" means that no radicals are generated or means that if radicals are generated, the amount of radicals is extremely low enough to prevent proceeding of a polymerization reaction or even if a polymerization reaction proceeds, the physical properties of the adhesive layer are not affected. It is preferable that drying is carried out under reduced pressure, because radical generation from the component (c) by heating is suppressed as well as the remaining amount of the solvent can be reduced.

In order to suppress peeling of the adhesive layer during a solder-reflow process due to bubbles generated during heat-curing of the adhesive layer, it is preferable to sufficiently reduce the amount of volatile components present within or on the adhesive layer, such as a residual solvent, low molecular weight impurities, a reaction product(s), a decomposition product(s), a water derived from materials and water adsorbed to a surface.

After the heat-drying, a transparent substrate is bonded onto the adhesive layer by application of pressure.

Note that, the heat-drying can be omitted when a method of bonding an adhesive composition in a film form is employed in the adhesive layer formation step.

(Curing Step)

After the semiconductor substrate and the transparent substrate are bonded by application of pressure with the adhesive layer interposed between them, the adhesive layer is cured. As a curing method, curing with application of heat or light, or curing with application of heat and light is mentioned; however, curing with heat is particularly preferable.

In the curing step of forming a cured product of the adhesive layer, it is preferable that curing is performed for one to two hours while selecting temperature and increasing temperature step by step. It is preferable that the curing is performed within the range of 100 to 200° C.

Note that, it is not necessary that the press-bonding step and curing step are independent steps. Curing can be simultaneously carried out while press-bonding.

<Physical Properties of Cured Product of Adhesive Layer>

The Tg of the cured product of the adhesive layer according to the embodiment having the aforementioned composition is preferably −10° C. or more and more preferably 0° C. or more.

The elastic modulus at 25° C. of the cured product of the adhesive layer according to the embodiment is preferably 0.01 GPa or more, more preferably 0.1 GPa or more and further preferably 0.5 GPa or more. Note that, the upper limit of the elastic modulus at 25° C., which is not particularly limited, is preferably 10 GPa or less from a practical point of view.

<Optical Parts>

The optical parts according to the embodiment have a non-cavity structure using the aforementioned adhesive composition. Now, the backside-illuminated structure of a solid-state imaging element, will be described as an example of the optical parts according to the embodiment, if necessary, referring to the accompanying drawings.

FIG. 1 is a plan view showing a solid-state imaging element according to the embodiment. As shown in FIG. 1, a CMOS image sensor 1 according to the embodiment has a sensor section 3 (also referred to as a "light receiving section 3") having a plurality of microlenses 12 arranged therein, at a center region. Around the sensor section 3, a peripheral circuit section 4 is present, in which a circuit is formed. Further, a glass substrate 5 is provided so as to cover at least the sensor section 3.

Figure 2:
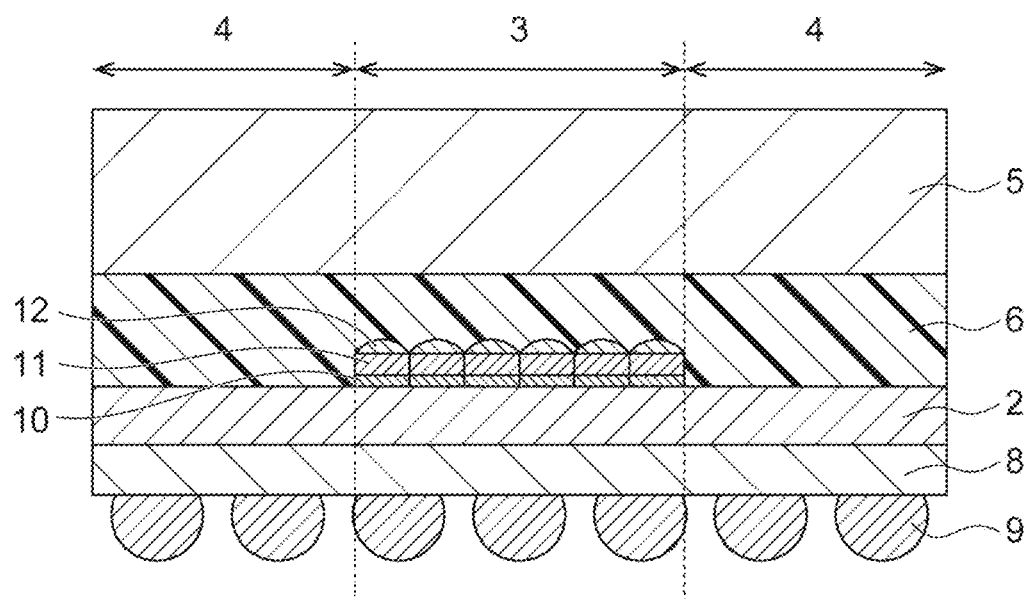
FIG. 2 is a sectional view along the A-A' line of FIG. 1.

FIG. 2 is a sectional view along the A-A' line of FIG. 1. As shown in FIG. 2, on one of the surfaces of a silicon substrate 2, a plurality of photodiodes 10 are formed. On the upper surface of each of the photodiode 10, a color filter 11 is provided so as to cover at least the photodiode 10. On the upper surface of the color filter 11, a microlens 12 is formed. The color filter 11 is provided to every photodiode 10 and individual microlenses 12 are provided at the positions corresponding to the color filters 11 respectively. An adhesive layer 6 formed of the adhesive composition according to the embodiment is formed over the whole surface of the silicon substrate 2 on which the microlenses 12 are formed. On a surface of the adhesive layer 6, a glass substrate 5 is provided. Likewise, a structure having no cavity portion (non-cavity structure) is formed. On the other surface of the silicon substrate 2, a wiring layer 8 is arranged. On the lower surface of the wiring layer 8, solder balls 9 are provided.

Figure 3:
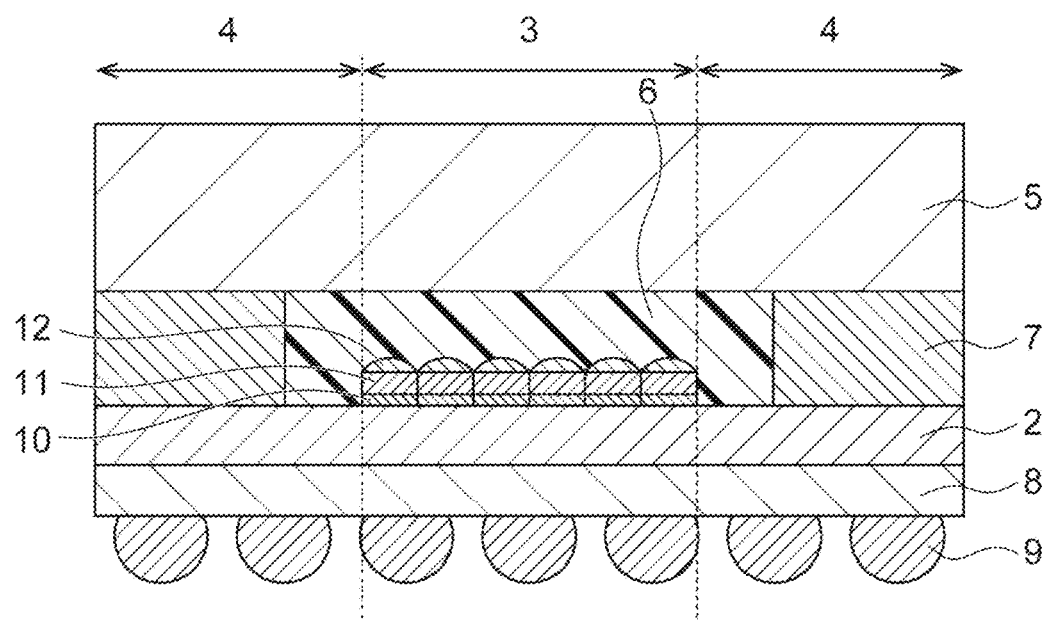
FIG. 3 is a sectional view showing another solid-state imaging element according to the embodiment.

FIG. 3 is a sectional view showing another solid-state imaging element according to the embodiment. In FIG. 3, on the surface of the silicon substrate 2 where the microlenses 12 are provided, a frame-like adhesive layer 7 is provided in the periphery so as not to cover the microlenses 12. On the upper surface of the frame-like adhesive layer 7, the glass substrate 5 is arranged. The portion surrounded by the silicon substrate 2, the frame-like adhesive layer 7 and the glass substrate 5 is filled with the adhesive composition according to the embodiment to form the adhesive layer 6, with the result that a non-cavity structure is formed. In the solid-state imaging element according to the embodiment shown in FIG. 3, the adhesive layer 6 serves not only as an adhesive for bonding the silicon substrate 2 and the glass substrate 5 but also as a sealing material to seal the microlenses 12, color filters 11 and the photodiodes 10 by filling the cavity portion.

In a conventional non-cavity structure, an adhesive rib (hereinafter referred to simply as the "rib") is formed so as to surround a light receiving section, and thereafter, the light receiving section is filled with a transparent sealing material to bond to a transparent substrate (for example, glass) for sealing. In the non-cavity structure shown in FIG. 3, an adhesive rib (the frame-like adhesive layer 7) is formed, and thereafter, the cavity portion is filled with the adhesive composition according to the embodiment to form the adhesive layer 6. In the non-cavity structure manufactured in this manner, other portions except the rib are sufficiently adhesive, with the result that more highly reliable non-cavity structure can be obtained. In contrast, in the non-cavity structure shown in FIG. 2, a rib is not formed and the silicon substrate 2 and the glass substrate 5 having transparency are bonded via the adhesive layer 6 formed of the adhesive composition according to the embodiment. This is because the adhesive composition according to the embodiment can serve as an adhesive and a sealing material. In this non-cavity structure shown in FIG. 2, compared to the non-cavity structure shown in FIG. 3, formation of a rib is not required and a non-cavity structure can be easily formed. In addition, instruments such as a printer, an exposure machine and a developer required for forming a rib are not required.

Figure 4:
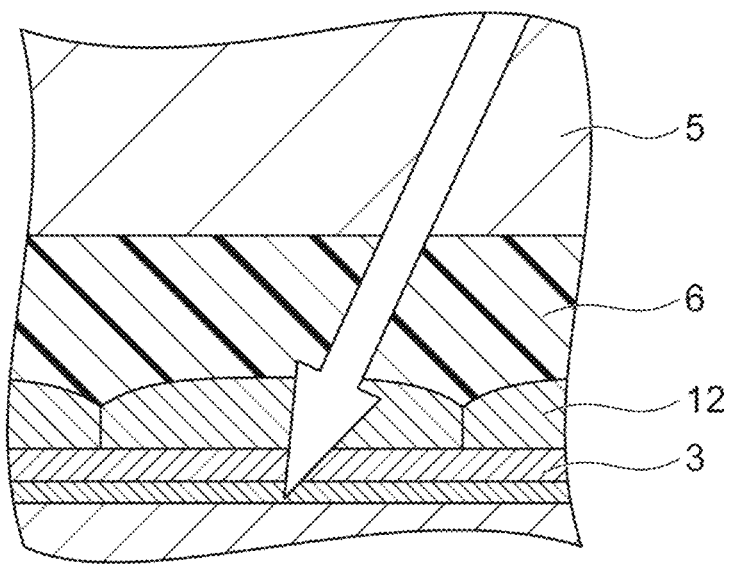
FIG. 4 is a sectional view of a non-cavity structure.
Figure 5:
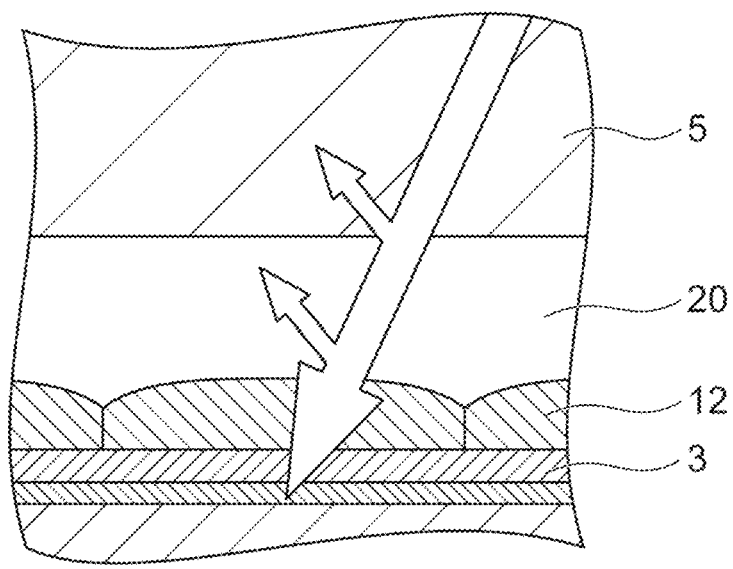
FIG. 5 is a sectional view of a cavity structure.

FIG. 4 and FIG. 5 each illustrates refraction at the interface of cavity portions of a non-cavity structure and a cavity structure, which differ in refractive-index. Assuming that the glass substrate 5 has a refractive index, nD=about 1.47, an air layer 20 of a cavity portion has a refractive index, nD=about 1.00, the microlens 12 has a refractive index, nD=about 1.60, and the adhesive layer 6 has a refractive index, nD=about 1.50, the light loss by interface reflection of the non-cavity structure shown in FIG. 4 is calculated to be lower by about 8% than that of the cavity structure shown in FIG. 5. The refractive index value of the adhesive composition to be used in the embodiment is generally nD=around 1.50.

Figure 6:
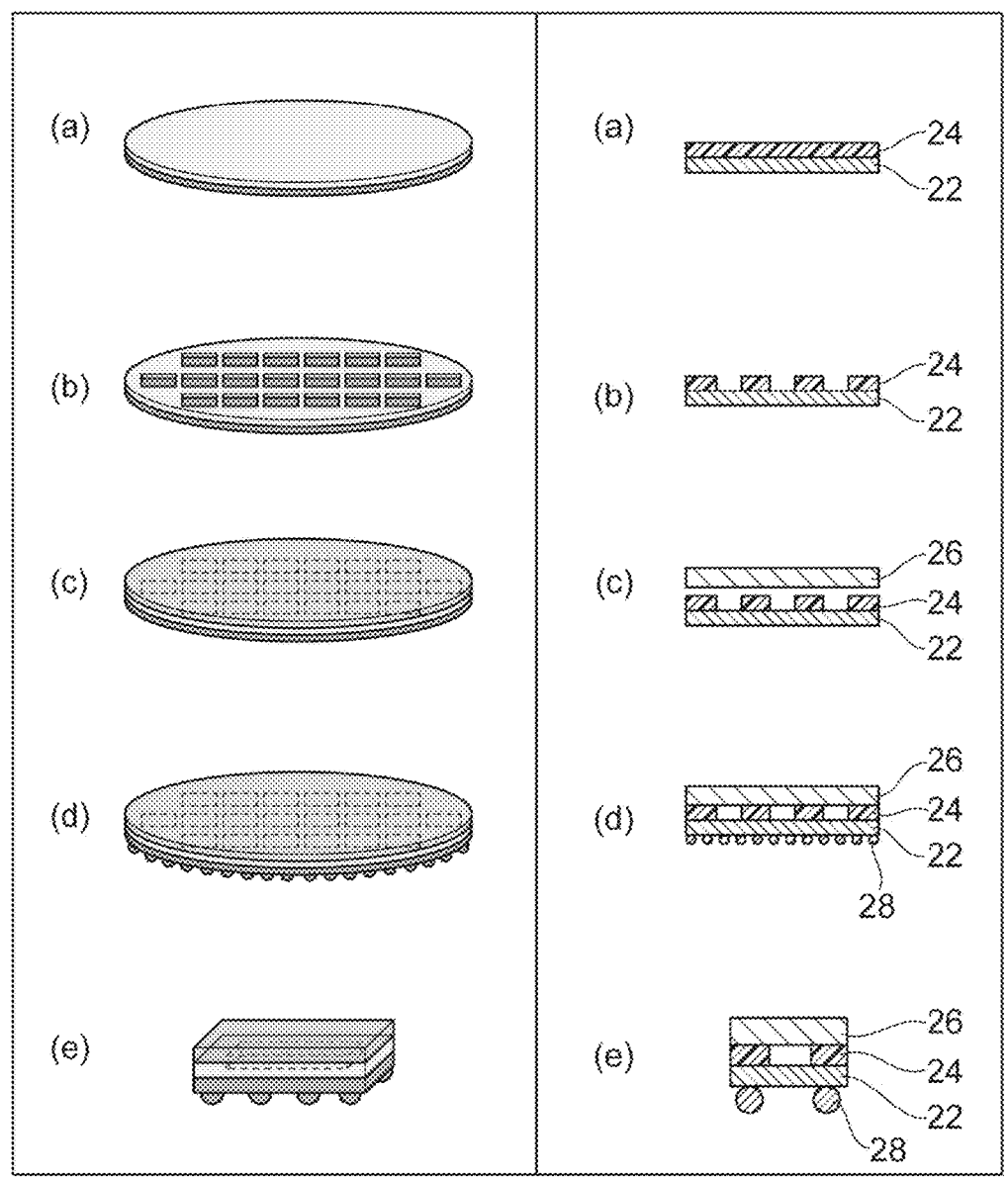
FIG. 6 shows a process drawing illustrating the steps of a method for manufacturing a solid-state imaging element having a cavity structure.
Figure 7:
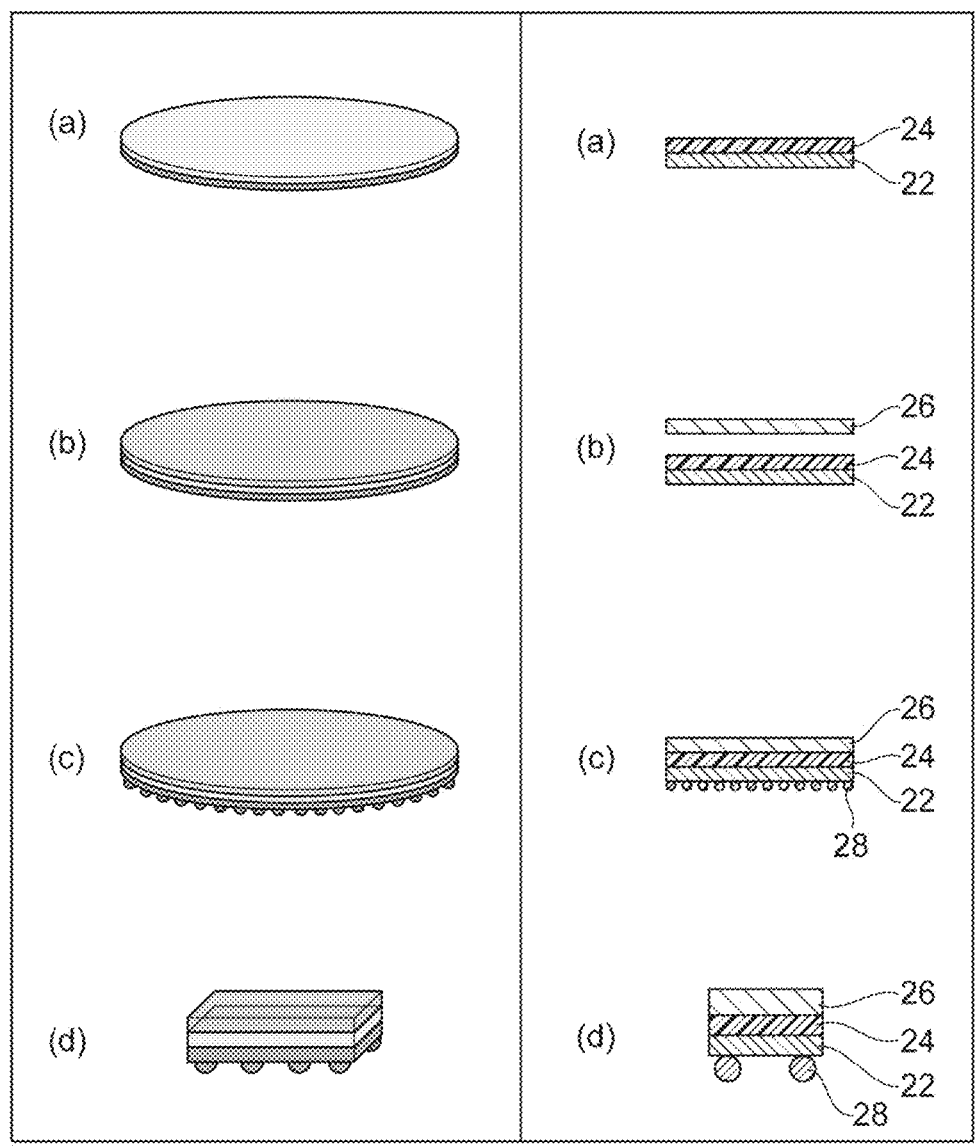
FIG. 7 shows a process drawing illustrating the steps of a method for manufacturing a solid-state imaging element having a non-cavity structure.

Each of FIG. 6 and FIG. 7 is process drawing illustrating the steps of methods for manufacturing solid-state imaging elements having a cavity structure and a non-cavity structure, respectively. In FIG. 6 and FIG. 7, schematic perspective views for individual steps are shown on the left side; whereas the corresponding schematic end views are shown on the right side. In the conventional rib formation process shown in FIG. 6, (a) resin formation (laminate, spin coat), (b) light exposure and development, (c) glass sealing, (d) resin curing and (e) dicing steps are required. To describe more specifically, (a) a resin layer 24 is formed on a substrate 22. (b) The resin layer 24 is exposed to light and developed to form a rib. (c) This was sealed with a glass substrate 26. (d) The resin layer is cured; at the same time, if necessary, back-grinding (BG) processing, formation of through-silicon via (TSV) electrode processing and mounting of the solder balls 28 are performed. (e)The resultant structure is diced to obtain a solid-state imaging element having a cavity structure. In contrast, in the whole surface sealing process shown in FIG. 7, since a rib formation step is not required, the light exposure and development step is not needed. Thus, immediately after an adhesive is formed on a silicon substrate, sealing with a glass substrate can be made. Thereafter, the resultant structure is divided into individual devices by dicing, etc.

In the methods shown in FIG. 6 and FIG. 7, the resin layer 24 is formed on the substrate 22, followed by sealing with the glass substrate 26; however, after the resin layer 24 is formed on the glass substrate 26, sealing with the substrate 22 may be performed.

Examples of a method for manufacturing a solid-state imaging element having a non-cavity structure using the adhesive composition according to the embodiment include methods shown in FIG. 8 to FIG. 15.

Figure 8:
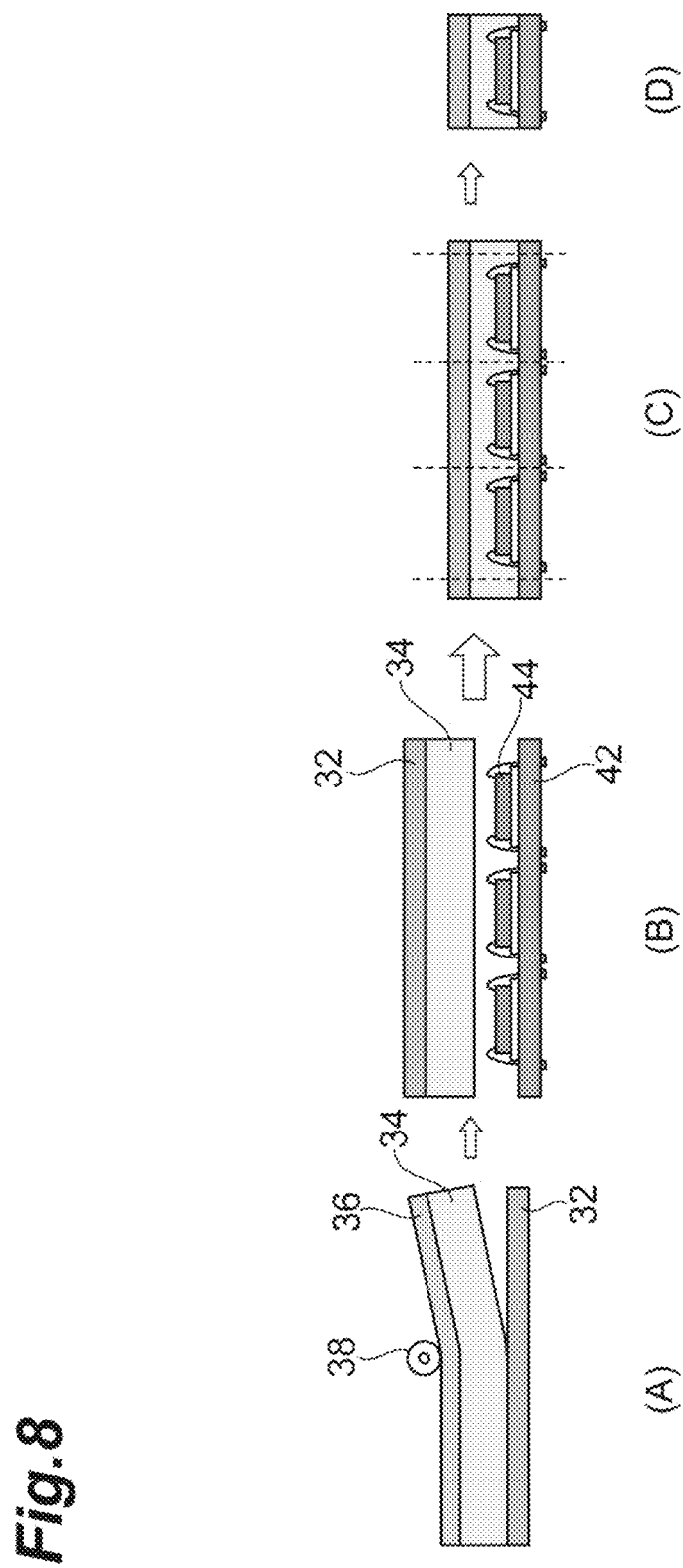
FIG. 8 shows a process drawing illustrating the steps of another method for manufacturing a solid-state imaging element having a non-cavity structure.

FIG. 8 shows a method in which a sheet or film formed of the adhesive composition according to the embodiment, is laminated on a wafer together with the glass substrate and a resin is cured, and then, dicing is carried out. To describe more specifically, (A) an adhesive composition in a film form 34 formed on a support film 36 is bonded onto a glass substrate 32 by use of a roller 38. (B) After the support film 36 is removed, the adhesive composition in a film form 34 having the glass substrate 32 laminated thereon is bonded to a substrate 42 having sensors 44 mounted thereon by applying pressure. (C) This was diced into individual sensors, and then (D) a solid-state imaging element is obtained.

Note that, in FIG. 8, the method of bonding the adhesive composition in a film form 34 to the glass substrate 32 in advance was explained; however, the adhesive composition in a film form 34 formed on the support film 36 is bonded to the substrate 42 having the sensors 44 mounted thereon by applying pressure, and then the support film 36 is removed and the glass substrate 32 may be bonded by applying pressure.

Figure 9:
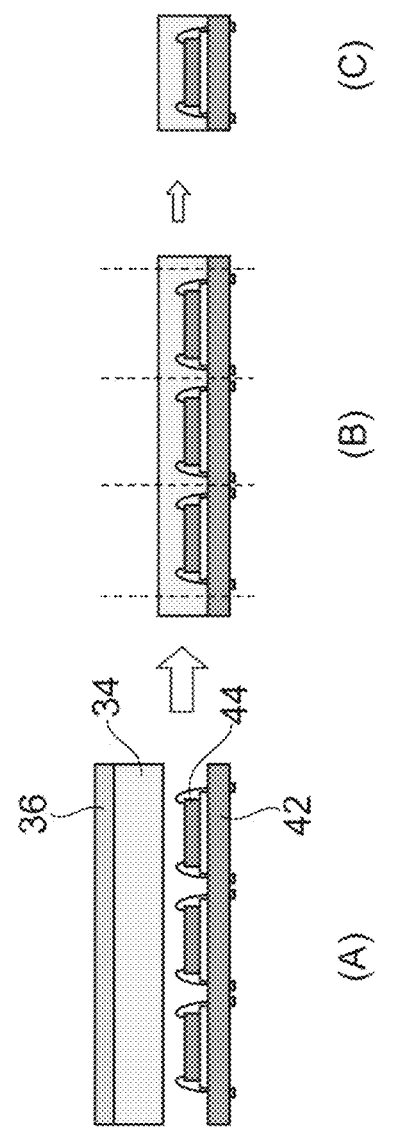
FIG. 9 shows a process drawing illustrating the steps of another method for manufacturing a solid-state imaging element having a non-cavity structure.

The adhesive composition according to the embodiment provides a cured product having high transparency, airtightness and high refractive index. Thus, the adhesive composition serves as a glass substrate in addition to a function as an adhesive. Because of this, as shown in FIG. 9, a solid-state imaging element not sealed with a glass substrate can be manufactured (see FIG. 16).

Figure 10:
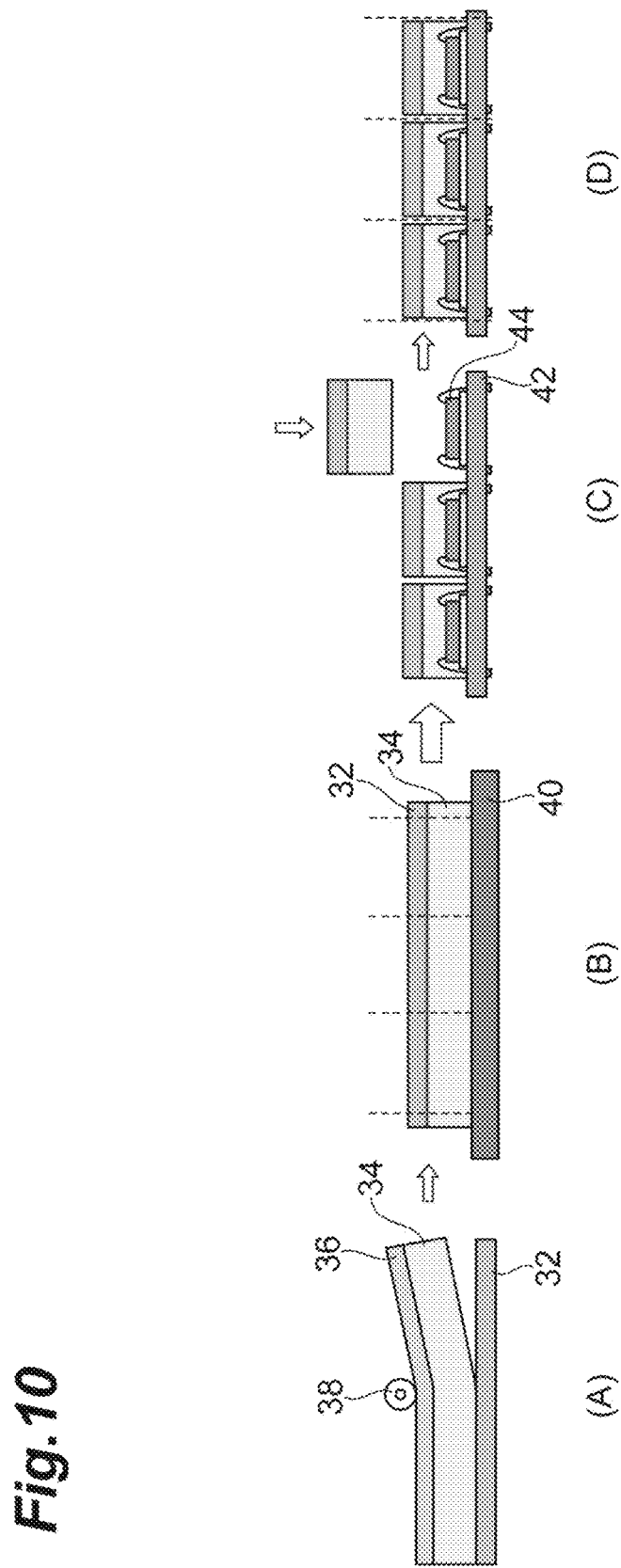
FIG. 10 shows a process drawing illustrating the steps of another method for manufacturing a solid-state imaging element having a non-cavity structure.

Furthermore, a method as shown in FIG. 10 may be employed. More specifically, the adhesive composition in a film form 34 having the glass substrate 32 laminated thereon is separated into pieces on a support base 40 in advance and the individual pieces of the adhesive composition in a film form 34 are laminated on the sensors 44.

Figure 11:
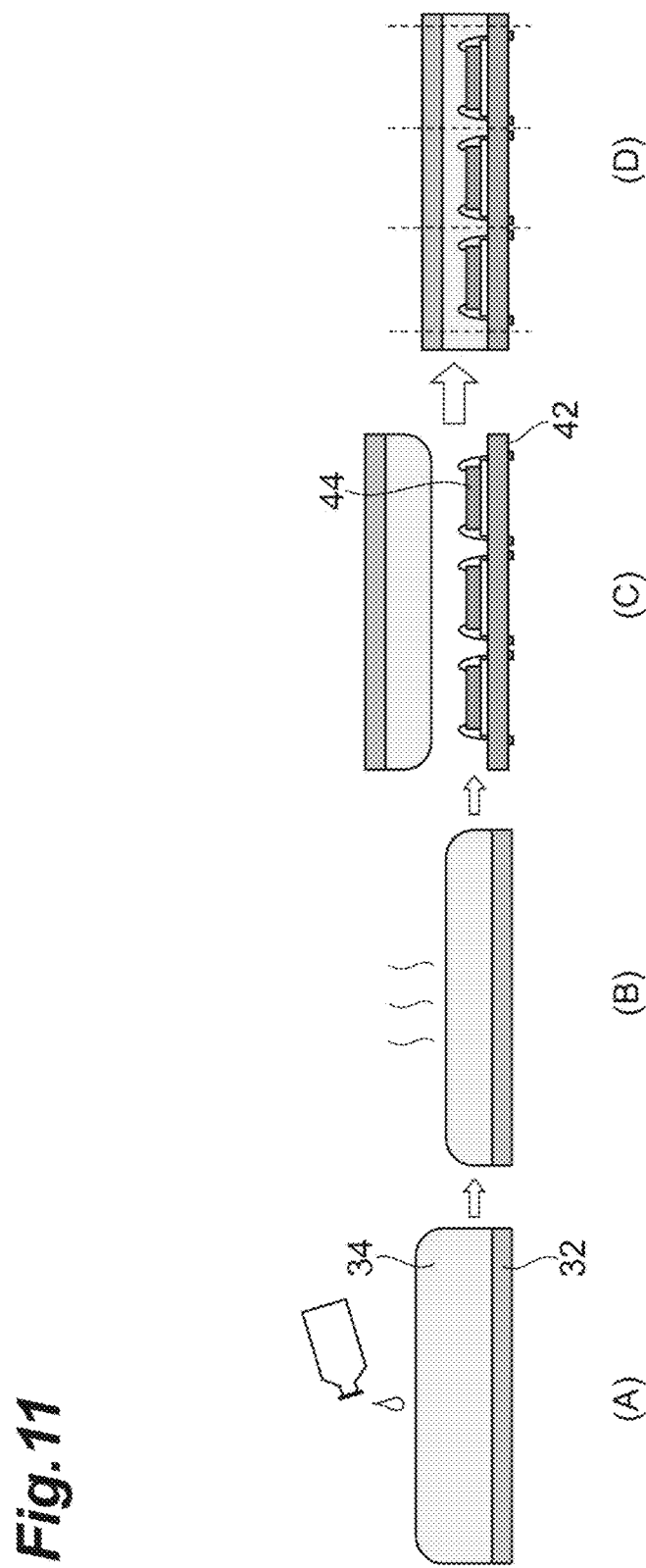
FIG. 11 shows a process drawing illustrating the steps of another method for manufacturing a solid-state imaging element having a non-cavity structure.

In the method shown in FIG. 11, the adhesive composition according to the embodiment in the state of liquid is applied to a glass substrate in accordance with a spin coat method, etc., and converted into the B stage, and then, laminated on a wafer, a resin is cured and the resultant structure is diced. More specifically, (A) the adhesive composition 34 is applied onto the glass substrate 32. (B) This is heated to convert the adhesive composition 34 into the B stage. (C) The adhesive composition 34 in the B stage is bonded to the substrate 42 having the sensors 44 mounted thereon by application of pressure. (D) The resultant structure is diced to obtain solid-state imaging elements.

Figure 13:
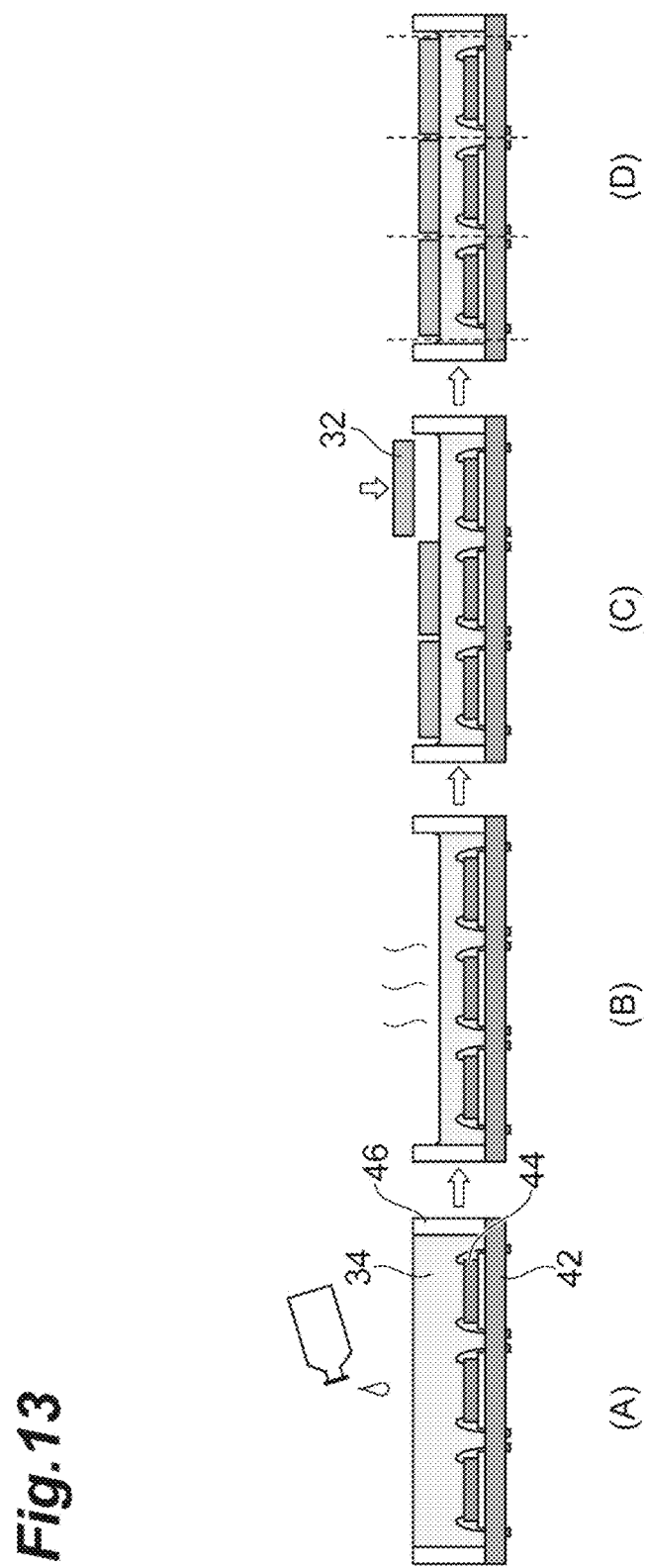
FIG. 13 shows a process drawing illustrating the steps of another method for manufacturing a solid-state imaging element having a non-cavity structure.

Note that, when the adhesive composition is applied, a weir 46 for keeping the adhesive composition 34 to stay on the substrate 42 may be provided in the periphery portion, in the same manner as shown in FIG. 13.

Figure 12:
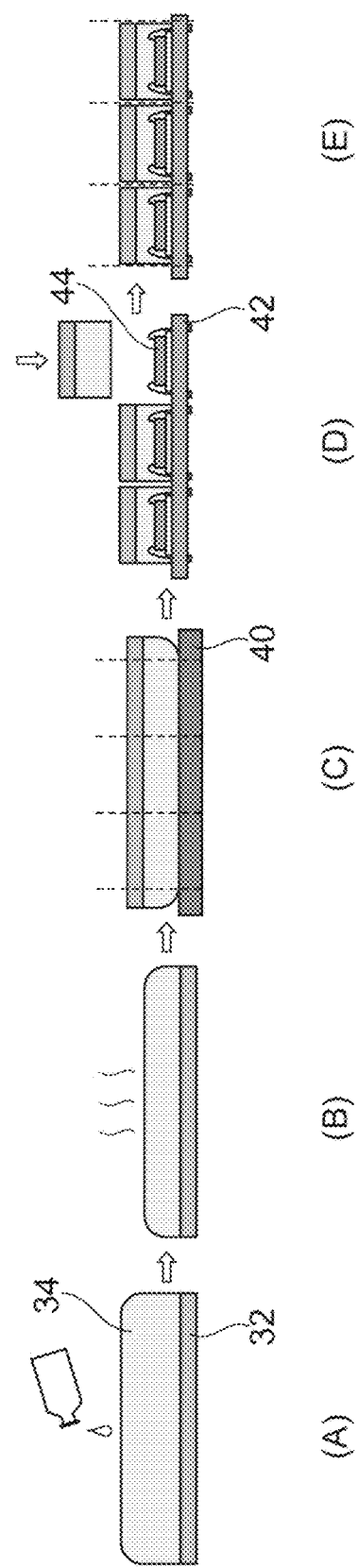
FIG. 12 shows a process drawing illustrating the steps of another method for manufacturing a solid-state imaging element having a non-cavity structure.

As shown in FIG. 12, before lamination on the wafer, the construct consisting of the adhesive composition 34 converted into the B stage and the glass substrate 32 is diced into pieces on the support base 40 in advance, individual pieces of the construction of adhesive composition 34 and the glass substrate 32 may be laminated on the sensors 44.

In the method shown in FIG. 13, the adhesive composition is applied onto a wafer and converted into the B stage on the wafer. The resultant construct is sealed with a glass substrate, a resin is cured and the resultant structure is diced. More specifically, (A) a weir 46 for keeping the adhesive composition 34 is provided on the periphery portion of the substrate 42 having the sensors 44 mounted thereon, and then the adhesive composition 34 is applied. (B) This is heated to convert the adhesive composition 34 into the B stage. (C) The pieces of the glass substrate 32 are mounted on the adhesive composition in the B stage. (D) The resultant structure is diced to obtain solid-state imaging elements.

In the methods shown in FIG. 8 to FIG. 13, the adhesive composition is formed on a wafer and the construct is diced; however, the adhesive composition may be formed on diced chips of a wafer.

Figure 14:
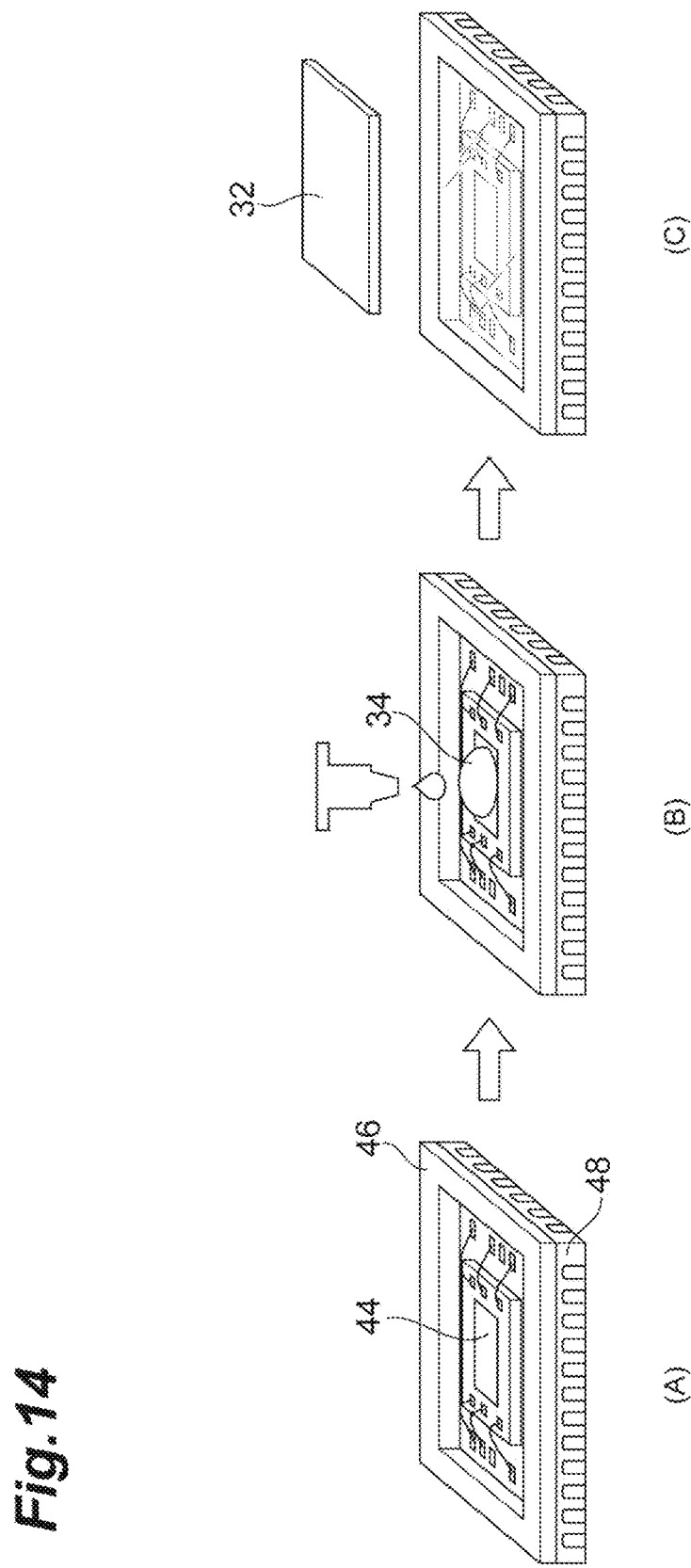
FIG. 14 shows a process drawing illustrating the steps of another method for manufacturing a solid-state imaging element having a non-cavity structure.
Figure 15:
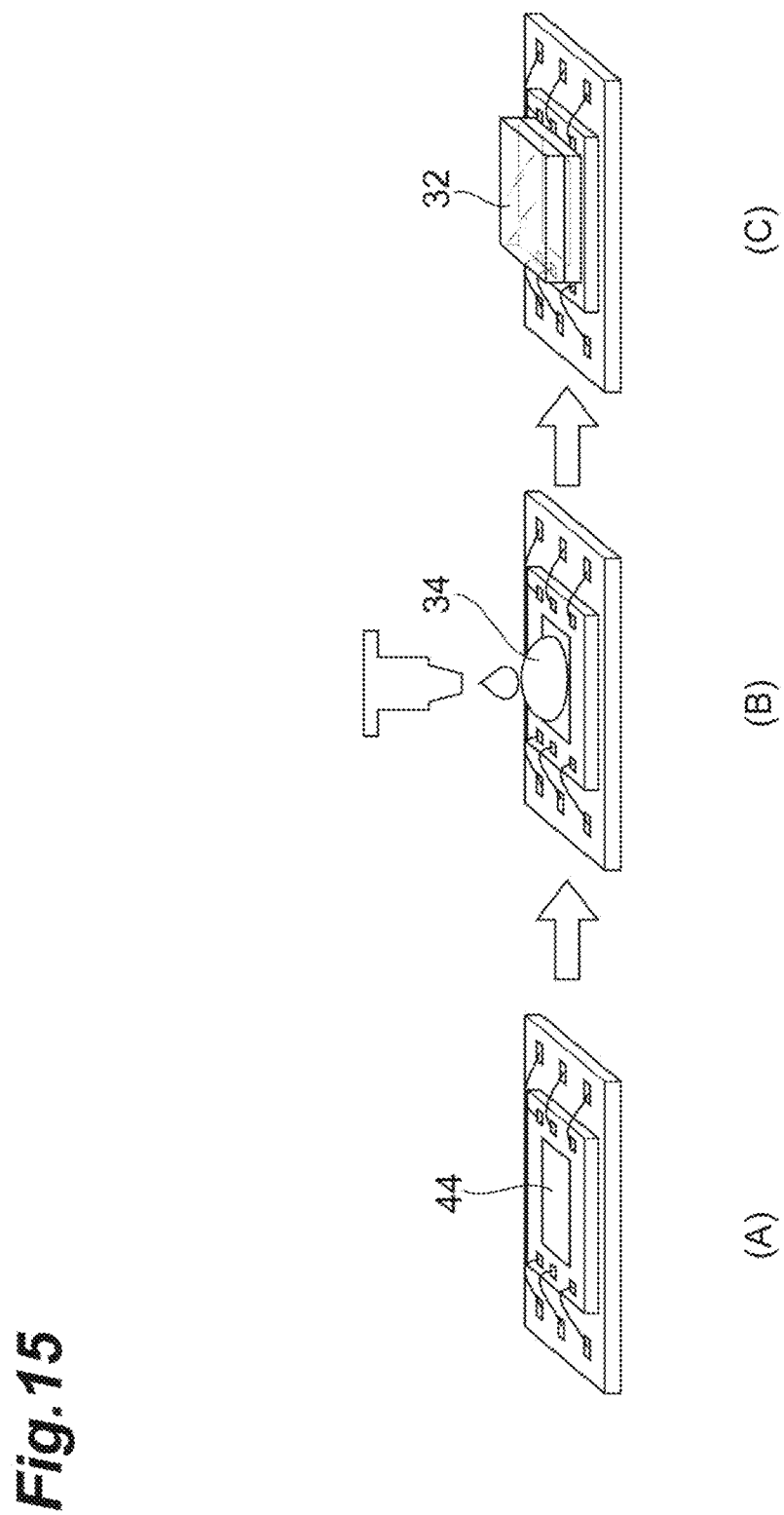
FIG. 15 shows a process drawing illustrating the steps of another method for manufacturing a solid-state imaging element having a non-cavity structure.

FIG. 14 and FIG. 15 show methods of applying a liquid-state adhesive composition onto a chip having a sensor mounted thereon. In FIG. 14, (A) the weir 46 is provided on the periphery portion of a chip 48 having the sensor 44 mounted thereon. (B) The adhesive composition 34 is applied onto the sensor 44. (C) Sealing is made by the glass substrate 32 to obtain a solid-state imaging element.

As shown in FIG. 15, the adhesive composition 34 is applied only to the sensor 44 without providing the weir 46 and then sealing is made by the glass substrate 32.

Note that, in FIG. 14 and FIG. 15, methods of using a liquid-state adhesive composition were described; however, the adhesive composition in a film form can be used similarly to the above.

Figure 17:
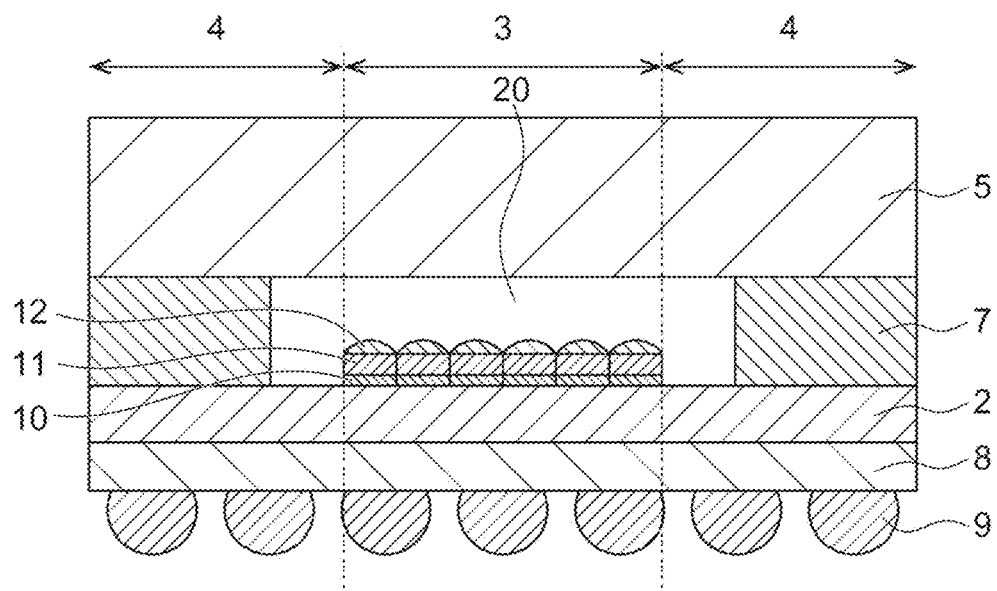
FIG. 17 is a sectional view showing a backside-illuminated solid-state imaging element having a conventional cavity structure.

FIG. 17 is a sectional view showing a backside-illuminated solid-state imaging element having a conventional cavity structure. In FIG. 17, on the silicon substrate 2, a cavity 20 surrounded by a frame-like adhesive layer 7 and the glass substrate 5 is present.

As described, in the conventional cavity structure, a frame-like structure is formed of an adhesive by use of a photolithographic method, a printing method and a dispensing method. Thereafter, it is necessary to bond a glass substrate and a silicon substrate via the obtained frame-like adhesive. Thus, in the cavity structure, the adhesive composition as used in the present invention is not needed; however, an adhesive for forming the frame-like structure is required.

The non-cavity structure using the adhesive composition according to the embodiment has the following merits compared to conventional cavity structures.

In a cavity structure, if a glass substrate has a flaw, image quality may deteriorate due to light scattering, reflection, diffraction, etc. In this regard, such a deterioration in image quality due to a flaw of a glass substrate can be mitigated by employing the non-cavity structure according to the embodiment because interface refractive-index difference decreases and light scattering, reflection, diffraction, etc., are suppressed.

In the cavity structure, deterioration of image quality is caused by foreign matter bonded to microlenses portion, a glass substrate, etc. Foreign matter is attached because a cavity portion is exposed from formation of an adhesive until a glass substrate is bonded thereto. However, attachment of foreign matter can be reduced if the non-cavity structure according to the embodiment is employed because the exposure duration of the cavity portion is reduced and the amount of foreign matter to be bonded is reduced.

In the non-cavity structure, the adhesive layer must be transparent; however, the area at which the adhesive layer and the glass substrate are bonded is large, difference in stress to be applied by the adhesive within an element is low, compared to the cavity structure where a glass substrate is bonded only by a frame-like adhesive layer, with the result that peeling, deformation, etc., of the adhesive are reduced.

In the cavity structure, α beam emitted from glass is received by microlenses. As a result, there is a possibility of reducing the image quality. For the reason, high purity glass, which is usually expensive, must be used. In contrast, in the non-cavity structure according to the embodiment, since α beam can be absorbed by the adhesive layer, the non-cavity structure has an advantage of using inexpensive glass.

The CMOS image sensor according to the embodiment is integrated into, for example, mobile phones. In this case, the CMOS image sensor is integrated in the mother board of a mobile phone via solder balls and optical lenses are arranged in the upper side of the sensor, more specifically, on the side of the glass substrate.

In the foregoing, the embodiment was explained; however, the present invention is not limited to the embodiment. For example, modification can be appropriately made by those skilled in the art by addition or deletion of constitutional structures or change of design, or addition or deletion of a step(s) or change of conditions with respect to the respective embodiments described above. These modifications are included in the scope of the present invention, as long as the modification is not against the gist of the present invention.

For example, if an optical member is manufactured using a liquid-state adhesive composition according to the embodiment, a method of injecting the liquid-state adhesive composition in the space between a wafer or a chip and a glass substrate may be employed.

In the above embodiment, a case where a glass substrate is used as a transparent substrate was described; however, the transparent substrate of the present invention is not limited to this. Any transparent substrate may be used as long as it has necessary strength, rigidity and light transmittance.

Figure 16:
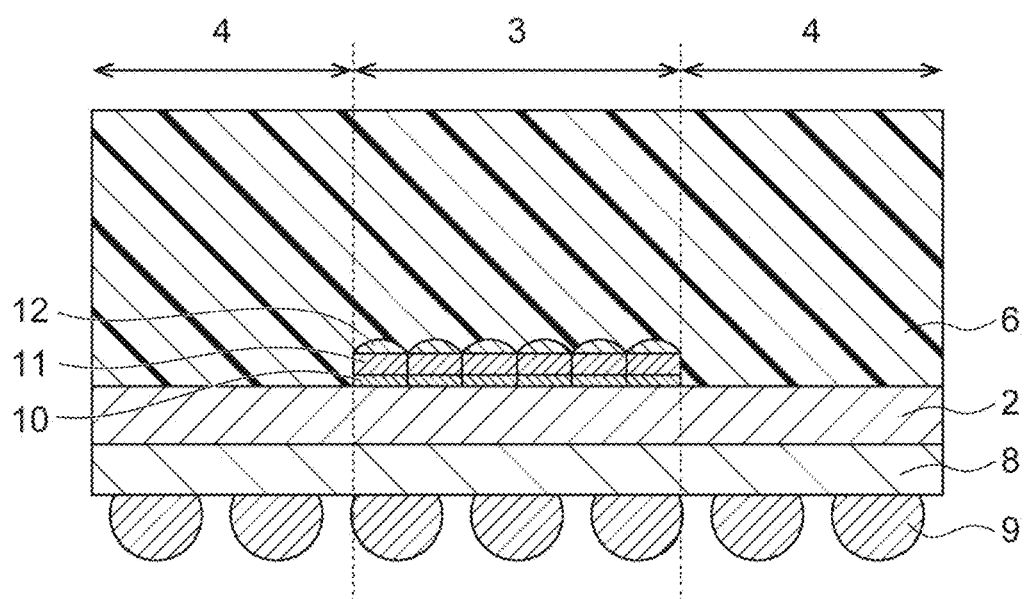
FIG. 16 is a sectional view showing another solid-state imaging element of the embodiment.

As mentioned above, the adhesive composition according to the embodiment provides a cured product having high transparency, airtightness and a high refractive index. Thus, for example, the solid-state imaging element according to the embodiment may not be sealed with a transparent substrate such as a glass substrate, as shown in FIG. 16.

EXAMPLES

Now, present invention will be more specifically described below based on Examples and Comparative Examples; however, the present invention is not limited to the following Examples.

(Component (a))

The weight-average molecular weight of the component (a) was measured by gel permeation chromatography (GPC) and converted based on a calibration curve using standard polystyrene. The calibration curve was approximated based on a tertiary expression by use of a standard polystyrene kit, PStQuick series C (trade name, TOSOH CORPORATION). The conditions of GPC are shown below.

Pump: L6000 Pump (Hitachi, Ltd.)
Detector: L3300 RI Monitor (Hitachi, Ltd.)
Column: Gelpack GL-S300MDT-5 (two columns in total) (trade name, Hitachi High-Technologies Corporation)
Column size: 8 mm in diameter×300 mm
Eluent: DMF/THF (mass ratio: 1/1)+LiBr.$H_2O$ 0.03 mol/l+$H_3PO_4$ 0.06 mol/l
Sample concentration: 0.1 mass %
Flow rate: 1 ml/min
Measurement temperature: 40° C.
<Synthesis of Acrylic Polymer>
(a-1)

300 g of tricyclo [$5.2.1.0^{2,6}$]deca-8-yl acrylate (FA-513A, trade name, Hitachi Chemical Co., Ltd.), 350 g of butyl acrylate (BA), 300 g of butyl methacrylate (BMA), 50 g of glycidyl methacrylate (GMA) and 50 g of 2-ethylhexyl methacrylate (2EHMA) were mixed. To the monomer mixture, 5 g of dilauroyl peroxide and 0.45 g of n-octyl mercaptan serving as chain transfer agent were further dissolved to obtain a mixture solution.

To a 5-L autoclave equipped with a stirrer and a condenser, 0.44 g of polyvinyl alcohol serving as a suspension agent and 2000 g of ion-exchange water were added. Further, the mixture solution prepared above was added thereto while stirring. Polymerization was carried out while stirring at a rotation speed of 250 $min^{-1}$ under a nitrogen atmosphere at 60° C. for 5 hours, and subsequently at 90° C. for two hours to obtain resin particles (polymerization rate was 99% by the weighing method). The resin particles were washed with water, dehydrated and dried to obtain an acrylic polymer (a-1). The weight-average molecular weight Mw of the resultant polymer (a-1) was 480000.

(a'-2)

An acrylic polymer (a'-2) was obtained in the same manner as in (a-1) except that a glycidyl methacrylate (GMA) was not used. The weight-average molecular weight Mw of the resultant polymer (a'-2) was 520000.

(a'-3)

An epoxy group-containing acrylic polymer (HTR-860P-3, trade name, Nagase ChemteX Corporation) containing acrylonitrile (AN) in an amount of 30 mass % and glycidyl methacrylate (GMA) in an amount of 3 mass % on a monomer basis and having a weight-average molecular weight, Mw=800000 was specified as an acrylic polymer (a'-3).

(a-4)

An acrylic polymer (a-4) having a weight-average molecular weight Mw=600000 was obtained in the same manner as in (a-1) except that 2.4 mass % of glycidyl methacrylate, 43.5 mass % of methyl methacrylate, 18.3 mass % of ethyl acrylate and 35.8 mass % of butyl acrylate on a monomer basis were mixed.

(a-5)

An acrylic polymer (a-5) was obtained in the same manner as in (a-1) except that 1 mass % of acrylonitrile (AN) was further added to the monomer mixture. The weight-average molecular weight Mw of the obtained (a-5) was 420000.

(a-6)

An acrylic polymer (a-6) was obtained in the same manner as in (a-1) except that 2 mass % of acrylonitrile (AN) was further added to the monomer mixture. The weight-average molecular weight Mw of the obtained (a-6) was 390000.

(a-7)

An acrylic polymer (a-7) was obtained in the same manner as in (a-1) except that 3 mass % of acrylonitrile (AN) was further added to the monomer mixture. The weight-average molecular weight Mw of the obtained (a-7) was 380000.

(a-8)

An acrylic polymer (a-8) was obtained in the same manner as in (a-1). The weight-average molecular weight Mw of the obtained (a-8) component was 120000.

(a-9)

An acrylic polymer (a-9) having a weight-average molecular weight Mw=370000 was obtained in the same manner as in (a-1) except that 2.4 mass % of glycidyl methacrylate, 43.5 mass % of methyl methacrylate, 18.3 mass % of ethyl acrylate and 35.8 mass % of butyl acrylate on a monomer basis were mixed.

(a-10)

An acrylic polymer (a-10) having a weight-average molecular weight Mw=170000 was obtained in the same manner as in (a-1) except that 2.4 mass % of glycidyl methacrylate, 43.5 mass % of methyl methacrylate, 18.3 mass % of ethyl acrylate and 35.8 mass % of butyl acrylate on a monomer basis were mixed.

(a'-11)

An acrylic polymer (a'-11) having a weight-average molecular weight Mw=50000 was obtained in the same manner as in (a-1) except that 2.4 mass % of glycidyl methacrylate, 43.5 mass % of methyl methacrylate, 18.3 mass % of ethyl acrylate and 35.8 mass % of butyl acrylate on a monomer basis were mixed.

(a'-12)

To a 500 mL flask equipped with a stirrer, a reflux condenser, an inert gas inlet and a thermometer, 207 g of ethyl acetate, 33.5 g of methyl methacrylate, 1.5 g of methacrylic acid (MA), 24.5 g of butyl methacrylate (BMA), 3 g of butyl acrylate (BA), 7.5 g of 2-ethylhexyl methacrylate (2EHMA) and 30 g of benzyl acrylate (BzMA) were supplied. The temperature of the mixture was raised to 75° C. under a nitrogen gas atmosphere. While temperature of the flask was kept at 75° C., 0.7 g of 2,2'-azobis(2,4-dimethylvaleronitrile) (ADVN) was added dropwise. The mixture was stirred while heating for 6 hours and then cooled to room temperature to obtain an acrylic polymer (a'-12). The weight-average molecular weight Mw of the obtained (a'-12) was 620000.

Other compounds, i.e., commercially available compounds used herein, are as follows.

KMI-001 (trade name, Negami Chemical Industrial Co., Ltd.; maleimide-containing acrylic polymer, Mw=1010000)

KMI-101 (trade name, Negami Chemical Industrial Co., Ltd.; maleimide-containing acrylic polymer, Mw=970000)

UN-5507 (trade name, Negami Chemical Industrial Co., Ltd.; urethane acrylate oligomer, Mw=50000)

UN-3320HS (trade name Negami Chemical Industrial Co., Ltd.; urethane acrylate oligomer, Mw=4900)

UN-952 (trade name Negami Chemical Industrial Co., Ltd.; urethane acrylate oligomer, Mw=6500 to 11000)

W-197 (trade name, Negami Chemical Industrial Co., Ltd.; acrylic polymer containing EA and MMA as a main component, Mw=400000)

W-248 (trade name, Negami Chemical Industrial Co., Ltd.; acrylic polymer containing EA and MMA as a main component, Mw=450000)

The resultant acrylic polymers (a-1) to (a'-12) and commercially available compounds were subjected to the following evaluations. The evaluation results are shown in Table 1.

(Initial Transmittance)

The resultant acrylic polymers and commercially available compounds were each uniformly applied onto a glass substrate (MATSUNAMI MICRO COVER GLASS 40 mm×50 mm THICKNESS No. 1 (trade name), Matsunami Glass Ind., Ltd.), having a size of 4.0 cm×5.0 cm×120 to 170 μm (actually 140 to 160 μm) by use of a spin coater, and dried by a hot plate of 100° C. for 5 minutes to form an adhesive layer having a dry film thickness of 20 μm. In this manner, test substrates were manufactured. The test substrates having such an adhesive layer formed thereon were subjected to measurement of transmittance by use of a spectrophotometer U-3310 (trade name, Hitachi, Ltd.; start: 800 nm, end: 200 nm, scan speed: 600 nm/min, sampling interval: 1.0 nm) within the wavelength range of 800 to 300 nm. Initial transmittance values were evaluated based on the following criteria:

A: Transmittance at wavelength 400 nm is 97% or more.
B: Transmittance at wavelength 400 nm is less than 97%.

(Visual Observation of Appearance and Transmittance of Test Substrate Allowed to Stand Still at 245° C. for 5 Minutes)

The test substrates used in evaluation of the initial transmittance mentioned above were allowed to stand still on a hot plate of 245° C. for 5 minutes. Rolling, crack, white turbidity, outgassing, surface roughness, color change, etc., of the resin during the still standing were visually observed. In addition, transmittance of the substrates was measured except a substrate whose transmittance was not able to be measured due to white turbidity, etc.

(Adhesiveness During Heating)

To the adhesive layer of each of the test substrates formed in the same manner as those used in the above initial transmittance test, a glass substrate (MATSUNAMI MICRO COVER GLASS 40 mm×50 mm THICKNESS No. 1 (trade name), Matsunami Glass Ind., Ltd.) each having a size of 4.0 cm×5.0 cm×120 to 170 μm (actually 140 to 160 μm) was bonded at 90° C. by use of a reel laminator to obtain a test substrate of a three-layer structure: glass substrate/adhesive layer/glass substrate. The test substrates thus obtained were allowed to stand still on a hot plate of 245° C. for 5 minutes. During the still standing, whether the glass substrate and the adhesive layer are separated from each other was observed. Adhesiveness during heating was evaluated based on the following criteria:

A: Separation (peel-off) was not observed.
B: Separation (peel-off) was observed.

(Tg of the Component (a))

Tg of the component (a) was measured by a method in accordance with JIS K 6240 (Rubber, raw-Determination of the glass transition temperature by differential scanning calorimetry (DSC)).

TABLE 1

| | | Mw | AN | GMA | FA-513A | Tg | Initial transmittance | After 5 min at 245° C. | Adhesiveness during heating |
|---|---|---|---|---|---|---|---|---|---|
| Unit | | | Mass % *3 | Mass % *3 | Mass % *3 | ° C. | Transmittance % A/B | Transmittance % Visual observation | A/B |
| Synthetic compound | (a-1) | 480000 | 0 | 4.7 | 28.5 | 10 | 99% A | 99% No change | B |
| | (a'-2) | 520000 | 0 | 0 | 30.0 | — | 99% A | 99% No change | B |

TABLE 1-continued

| | | Mw | AN | GMA | FA-513A | Tg | Initial transmittance Unit | After 5 min at 245° C. | Adhesiveness during heating |
|---|---|---|---|---|---|---|---|---|---|
| | | | Mass % *3 | Mass % *3 | Mass % *3 | ° C. | Transmittance % A/B | Transmittance % Visual observation | A/B |
| | (a'-3) | 800000 | 30 | 3 | 0 | 10 | 98% A | 96% Change to yellow | B |
| | (a-4) | 600000 | 0 | 2.4 | 0 | 12 | 98% A | 98% No change | B |
| | (a-5) | 420000 | 1 | 4.7 | 28.5 | 10 | 99% A | 99% No change | B |
| | (a-6) | 390000 | 2 | 4.7 | 28.5 | 10 | 99% A | 99% No change | B |
| | (a-7) | 380000 | 3 | 4.6 | 28.4 | 12 | 99% A | 98% No change | B |
| | (a-8) | 120000 | 0 | 4.7 | 28.5 | 5 | 99% A | 98% No change | B |
| | (a-9) | 370000 | 0 | 2.4 | 0 | 10 | 99% A | 98% No change | B |
| | (a-10) | 170000 | 0 | 2.4 | 0 | 10 | 99% A | 98% No change | B |
| | (a'-11) | 50000 | 0 | 2.4 | 0 | 0 | 99% A | 98% No change | B |
| | (a'-12) | 62000 | 0 | 0 | 0 | −5 | 99% A | 99% Surface roughness | B |
| Commercially available compound | KMI-001 | 1010000 | — | 0 | — | — | B*1 | — | B |
| | KMI-101 | 970000 | — | 0 | — | — | B*1 | — | B |
| | UN-5507 | 50000 | — | 0 | — | — | 96% B | — | B |
| | UN-3320HS | 4900 | — | 0 | — | — | 98%*2 B | — | B |
| | UN-952 | — | — | 0 | — | — | 98% A | 96% Change to yellow | B |
| | W-197 | 400000 | 0 | 0 | — | — | 99% A | —% Surface roughness | B |
| | W-248 | 450000 | 0 | 0 | — | — | 98% A | —% Surface roughness | B |

*1Fail to evaluate due to white turbidity
*2Crack was developed in the surface
*3: Content to whole monomer mixture From the above results, it was found that urethane acrylate oligomers and acrylic polymers have high initial transparency regardless of molecular weight, etc., and that acrylic polymers having a low ratio of a nitrogen atom-containing group, have coloring resistance even after it was allowed to stand still at 245° C. for 5 minutes. In contrast, it was found that the adhesiveness during heating is not ensured by a component only containing a resin. White turbidity was observed in KMI-001 and KMI-101 probably due to strong cohesive force of a maleimide group, with the result that the initial transmittance and transmittance after still standing at 245° C. for 5 minutes were not evaluated. The transmittance in W-197 and W-248 was not measured because a stripe pattern like a crack was developed on the surface after still standing at 245° C. for 5 minutes.

<Confirmation of Effect of Presence or Absence of Structural Unit Having a Functional Group in Component (a)>

Each of the (a) acrylic polymers (a-1), (a'-2) and (a'-12), (b) a compound having at least two (meth)acryloyl groups and (c) a polymerization initiator were blended in accordance with the blending proportion (parts by mass) shown in the following Table 2 to obtain adhesive compositions. Note that, in Table 2, the numerals in the columns of components except the organic solvent represent solid contents in terms of parts by mass. Note that the solid content used in the specification refers to a nonvolatile content of an adhesive composition excluding volatile substances such as water and a solvent, more specifically, refers to components except a solvent, remaining without volatile in a drying step and including components present in a liquid, syrupy and waxy state at room temperature near 25° C. The adhesive compositions thus obtained were subjected to the following evaluations.

(Die Shear Strength at 150° C.)

In the opposite surface to the mirror surface of a silicon substrate of a 6-inch wafer having a thickness of 400 an incision line of 3 mm×3 mm having a depth of 300 μm was made. Onto the surface having the incision line, a dicing sheet was bonded as a support. The adhesive compositions obtained above were each uniformly applied onto the mirror surface of the silicon substrate having the incision line by use of a spin coater for 20 seconds at 100 min$^{-1}$ and thereafter, dried on a hot plate of 100° C. for 10 minutes to form an adhesive layer having a film thickness of 20 μm. In this manner, test substrates were prepared. The test substrate having an adhesive layer formed on the mirror surface of the silicon substrate was cleaved along the incision line to obtain 3 mm×3 mm silicon chips attached with the adhesive layer. A glass substrate (MATSUNAMI MICRO COVER GLASS 100 mm×100 mm THICKNESS No. 5 (trade name), Matsunami Glass Ind., Ltd. having a thickness of 0.45 to 0.6 mm) was diced into chips of 10 mm×10 mm in size to obtain glass chips. The silicon chips were bonded to the glass chips by applying pressure of 4.5 N at 70° C. for 5 seconds, and cured by heating at 200° C. for 2 hours to obtain test chips. The test chips were allowed to stand still on a hot plate of 150° C. for 20 seconds or more and 1 minute or less. Thereafter, die shear strength was measured by Dage-4000 (trade name, Dage Japan Co., Ltd). Ten test chips were prepared and measurement values of the 10 test chips were averaged to obtain as the die shear strength at 150° C.

(Adhesiveness During Heating)

To the adhesive layer of each of the test substrates prepared in the same manner as described in the section of initial transmittance, a glass substrate (MATSUNAMI MICRO COVER GLASS 40 mm×50 mm THICKNESS No. 1 (trade name), Matsunami Glass Ind., Ltd.) having a size of 4.0 cm×5.0 cm×120 to 170 μm (actually 140 to 160 μm) was bonded at 90° C. by use of a reel laminator to obtain a test substrate of a three-layer structure: glass substrate/adhesive layer/glass substrate. The test substrates thus obtained were allowed to stand still on a hot plate of 245° C. for 5 minutes. During the still standing, whether the glass substrate and the adhesive layer are separated from each other was observed. Adhesiveness during heating was evaluated based on the following criteria:

A: Separation (peel-off) was not observed.
B: Separation (peel-off) was observed.

TABLE 2

|  |  | Example 1 | Comparative Example 1 | Comparative Example 2 |
|---|---|---|---|---|
| Component (a) | (a-1) | 50 | — | — |
| Comparative component to (a) | (a'-2) | — | 50 | — |
|  | (a'-12) | — | — | 50 |
| Component (b) | A-DOG | 50 | 50 | 50 |
| Component (c) | PERCUMYL D | 1 | 1 | 1 |
| Adhesive aid | KBM-503 | 1 | 1 | 1 |
| Organic solvent | PGMEA | 115 | 115 | 115 |
| Component (d) | AO-80 | 2.5 | 2.5 | 2.5 |
|  | NR1 | 0.5 | 0.5 | 0.5 |
|  | AO-503 | 0.5 | 0.5 | 0.5 |
| Die shear strength | 150° C., after 20 s | 2.82 MPa | 0.90 MPa | 0.3 MPa |
| Adhesiveness during heating |  | A | B | B |

(Component (b))
A-DOG (trade name of dioxane glycol diacrylate, SHIN-NAKAMURA CHEMICAL CO., LTD.)
(Component (c))
PERCUMYL D (trade name of dicumyl peroxide, NOF CORPORATION, one hour half-life temperature: 135.7° C., 10 hours half-life temperature: 116.4° C.)
(Adhesion Aid)
KBM-503 (trade name of a silane coupling agent: 3-(trimethoxysilyl)propyl methacrylate, Shin-Etsu Chemical Co., Ltd.)

(Component (d))
AO-80 (trade name of a hindered phenolic antioxidant: bis [3-(3-tert-butyl-4-hydroxy-5-methylphenyl)propionate](2,4,8,10-tetra oxaspiro [5.5]undecane-3,9-diyl) bis(2,2-dimethyl-2,1-ethanediyl), ADEKA CORPORATION.)

NR1 (trade name of 1,3,5-tris(3-mercaptobutyryloxyethyl)-1,3,5-triazine-2,4,6(1H, 3H, 5H)-trione, KYOEISHA CHEMICAL Co., Ltd.)

AO-503 (trade name of a thioether-based antioxidant: ditridecyl 3,3-thiobispropionate, ADEKA CORPORATION.)

(Others)
PGMEA (chemical substance name of propylene glycol 1-monomethyl ether 2-acetate, KANTO KAGAKU.)

Example 1 and Comparative Example 1 differ in the component (a). Compounds (a-1) and (a'-2) are acrylic polymers having a weight-average molecular weight of 100000 or more and containing no nitrogen atom-containing group. However, the compound (a-1) has an adhesive strength at least three times as large as that of (a'-2) due to the content of a structural unit having the functional group derived from glycidyl methacrylate (GMA). From this, it was found that the component (a) to be used in the adhesive composition of the present invention must contain a structural unit having the functional group. In Comparative Example 2 using (a'-12) an acrylic polymer containing no structural unit having the functional group and a weight-average molecular weight of less than 100000, the adhesive strength was one third as large as that of Comparative Example 1. From the above, it was found that, in order to maintain the die shear strength during heating, the component (a) must have a weight-average molecular weight of 100000 or more and a structural unit having the functional group.

<Confirmation of Effect of Presence or Absence of Structural Unit having a Nitrogen Atom-containing Group in Component (a)>

Individual components were mixed in accordance with the blending proportion (parts by mass) shown in the following Table 3 to obtain adhesive compositions of Examples 1 to 5 and Comparative Example 3. Note that, in Table 3, the numerals in the columns of components except the organic solvent represent solid contents in terms of parts by mass. The adhesive compositions thus obtained were subjected to the following evaluations.

(Initial Transmittance)

Each of the adhesive compositions obtained was uniformly applied onto a glass substrate (MATSUNAMI MICRO COVER GLASS 40 mm×50 mm THICKNESS No. 1 (trade name), Matsunami Glass Ind., Ltd.) having a size of 4.0 cm×5.0 cm×120 to 170 μm (actually 140 to 160 μm) by use of a spin coater, and dried by a hot plate of 100° C. for 5 minutes to form an adhesive layer having a dry film thickness of 20 μm. In this manner, test substrates were manufactured. The test substrates having such an adhesive layer formed thereon were allowed to stand still on a hot plate of 265° C. for 15 minutes and then subjected to measurement of transmittance by use of a spectrophotometer U-3310 (trade name, Hitachi, Ltd.; start: 800 nm, end: 200 nm, scan speed: 600 nm/min, sampling interval: 1.0 nm) within the wavelength range of 800 to 300 nm.

TABLE 3

|  |  | Example 1 | Example 2 | Example 3 | Example 4 | Example 5 | Comparative Example 3 |
|---|---|---|---|---|---|---|---|
| Component (a) | (a-1) | 50 | — | — | — | — | — |
| Comparative component to (a) | (a'-3) | — | — | — | — | — | 50 |
| Component (a) | (a-5) | — | — | 50 | — | — | — |
|  | (a-6) | — | — | — | 50 | — | — |
|  | (a-7) | — | — | — | — | 50 | — |
|  | (a-9) | — | 50 | — | — | — | — |
| Component (b) | A-DOG | 50 | 50 | 50 | 50 | 50 | 50 |
| Component (c) | PERCUMYL D | 1 | 1 | 1 | 1 | 1 | 1 |
| Adhesive aid | KBM-503 | 1 | 1 | 1 | 1 | 1 | 1 |
| Organic solvent | PGMEA | 115 | 115 | 115 | 115 | 115 | 115 |
| Antioxidant (d) | AO-80 | 2.5 | 2.5 | 2.5 | 2.5 | 2.5 | 2.5 |
|  | NR1 | 0.5 | 0.5 | 0.5 | 0.5 | 0.5 | 0.5 |
|  | AO-503 | 0.5 | 0.5 | 0.5 | 0.5 | 0.5 | 0.5 |
| Transmittance (%) | 350 nm | 91.9 | 91.2 | 91.8 | 88.0 | 90.1 | 75 or less |
|  | 400 nm | 98.6 | 98.2 | 98.5 | 97.3 | 97.7 | 80 or less |
| Difference in transmittance |  | 6.7 | 7.0 | 6.7 | 9.3 | 7.6 | — |

In Comparative Example 3, due to the content of acrylonitrile (AN) component of 30 mass %, the substrate looks yellow even by visually observation and the transmittance values at 350 and 400 nm are as low as 80% or less. In contrast, Example 1 (AN content: 0 mass %) comprising a polymer (a-1) and Examples 3 to 5 comprising AN (AN content: 1 mass %, 2 mass %, 3 mass %, respectively) are mutually compared, the content of a copolymer component having a nitrogen atom-containing group in an acrylic polymer component is smaller, the better in order to suppress coloring of yellow. In particular, it is preferable that the content of AN is 5 mass % or less of the whole acrylic polymer.

<Confirmation of Effect of a Weight-average Molecular Weight of 100000 or More of the Component (a) and Presence of Two or More (meth)acryloyl Groups in the Component (b)>

(a) An acrylic polymer having a weight average molecular weight of 100,000 or more, (b) a compound having at least two (meth)acryloyl groups and (c) an initiator were mixed in accordance with the blending proportion (parts by mass) shown in the following Tables 4 to 7 to obtain adhesive compositions of Examples 1, 5 to 15 and Comparative Examples 4 to 15. In the components (a) used in Examples 1 and 6 to 15, the content of a structural unit having a nitrogen atom-containing group (AN amount) was 0 mass %; whereas in the component (a) used in Example 5, the content of structural unit having a nitrogen atom-containing group (AN amount) was 3 mass %. Note that, in Tables 4 to 7, the numerals in the columns of components except the organic solvent represent solid contents in terms of parts by mass.

(Component (b))

A-DCP (trade name of tricyclodecanedimethanol diacrylate, SHIN-NAKAMURA CHEMICAL CO., LTD.)

A-DOG (trade name of dioxane glycol diacrylate, SHIN-NAKAMURA CHEMICAL CO., LID.)

BPE-100 (trade name of ethylene oxide-modified bisphenol A dimethacrylate, SHIN-NAKAMURA CHEMICAL CO., LTD.)

BPE-500 (trade name of ethylene oxide-modified bisphenol A dimethacrylate, SHIN-NAKAMURA CHEMICAL CO., LTD.)

PE-3A (trade name of pentaerythritol triacrylate, KYOEISHA CHEMICAL Co., Ltd.)

A-9300 (trade name of ethylene oxide-modified isocyanuric acid triacrylate, SHIN-NAKAMURA CHEMICAL CO., LTD.)

(Comparative Component to (b))

BAH-100Y (trade name of epoxy acrylate, SHIN-NAKAMURA CHEMICAL CO., LTD.)

EHPE-3150 (trade name of alicyclic epoxy resin, Daicel Corporation)

YDCN-702 (trade name of cresol novolak epoxy resin, NIPPON STEEL & SUMIKIN CHEMICAL CO., LTD.)

LA (trade name of lacryl acrylate KYOEISHA CHEMICAL Co., Ltd.)

A-LEN-10 (trade name of ethylene oxide-modified o-phenylphenol acrylate, SHIN-NAKAMURA CHEMICAL CO., LTD.)

(Component (c))

PEROCTA O (trade name of 1,1,3,3-tetramethylbutylperoxy-2-ethyl hexanoate, NOF CORPORATION, one hour half-life temperature: 84.4° C., 10 hours half-life temperature: 65.3° C.)

PERCUMYL D (trade name of dicumyl peroxide, NOF CORPORATION, one hour half-life temperature: 135.7° C., 10 hours half-life temperature: 116.4° C.)

(Adhesion Aid)

KBM-503 (trade name of a silane coupling agent: 3-(trimethoxysilyl)propyl methacrylate, Shin-Etsu Chemical Co., Ltd.)

A-1160 (trade name of ureido-based silane coupling agent: 3-ureidopropyltriethoxysilane, Momentive Performance Materials Inc.)

(Component (d))

AO-80 (trade name of a hindered phenolic antioxidant: bis[3-(3-tent-butyl-4-hydroxy-5-methylphenyl)propionate](2,4,8,10-tetra oxaspiro[5.5]undecane-3,9-diyl) bis(2,2-dimethyl-2,1-ethanediyl), ADEKA CORPORATION.)

NR1 (trade name of 1,3,5-tris(3-mercaptobutyryloxyethyl)-1,3,5-triazine-2,4,6 (1H, 3H, 5H)-trione, KYOEISHA CHEMICAL Co., Ltd.)

AO-503 (trade name of a thioether-based antioxidant: 3,3-thiobispropionic acid ditridecyl, ADEKA CORPORATION.)

(Others)

Cyclohexanone (chemical substance name, KANTO KAGAKU.)

PGMEA (chemical substance name of propylene glycol 1-monomethyl ether 2-acetate, KANTO KAGAKU.)

1B2PZ (trade name of 1-benzyl-2-phenylimidazole, SHIKOKU CHEMICALS CORPORATION.)

TABLE 4

|  |  | Example 1 | Example 5 | Example 6 | Example 7 | Example 8 | Example 9 | Example 10 |
|---|---|---|---|---|---|---|---|---|
| Component (a) | (a-1) | 50 | — | 80 | — | — | — | — |
|  | (a-4) | — | — | — | 80 | — | — | — |
|  | (a-7) | — | 50 | — | — | — | — | — |
|  | (a-8) | — | — | — | — | 50 | — | — |
|  | (a-9) | — | — | — | — | — | 80 | — |
|  | (a-10) | — | — | — | — | — | — | 80 |
| Component (b) | A-DOG | 50 | 50 | 20 | 20 | 50 | 20 | 20 |
| Component (c) | PERCUMYL D | 1 | 1 | 1 | 1 | 1 | 1 | 1 |
| Adhesive aid | KBM-503 | 1 | 1 | — | — | — | — | — |
| Antioxidant (d) | AO-80 | 2.5 | 2.5 | — | — | — | — | — |
|  | NR1 | 0.5 | 0.5 | — | — | — | — | — |
|  | AO-503 | 0.5 | 0.5 | — | — | — | — | — |
| Organic solvent | Cyclohexanon | — | — | 170 | 170 | 170 | 170 | 170 |
|  | PGMEA | 115 | 115 | — | — | — | — | — |

TABLE 5

|  |  | Example 11 | Example 12 | Example 13 | Example 14 | Example 15 |
|---|---|---|---|---|---|---|
| Component (a) | (a-9) | 80 | 80 | 80 | 80 | 80 |
| Component (b) | A-DCP | 20 | — | — | — | — |
|  | BPE-100 | — | 20 | — | — | — |
|  | BPE-500 | — | — | 20 | — | — |
|  | PE-3A | — | — | — | 20 | — |
|  | A-9300 | — | — | — | — | 20 |
| Component (c) | PERCUMYL D | 1 | 1 | 1 | 1 | 1 |
| Organic solvent | Cyclohexanon | 170 | 170 | 170 | 170 | 170 |

TABLE 6

|  |  | Comparative Example 4 | Comparative Example 5 | Comparative Example 6 | Comparative Example 7 | Comparative Example 8 | Comparative Example 9 |
|---|---|---|---|---|---|---|---|
| Comparative component to (a) | (a'-11) | 80 | — | — | — | — | — |
|  | (a'-12) | — | 60 | — | — | — | — |
|  | UN-952 | — | — | 80 | — | — | — |
|  | UN-3320HS | — | — | — | 80 | — | — |
| Component (a) | (a-9) | — | — | — | — | 80 | 80 |
| Component (b) | A-DCP | 20 | 40 | 20 | 20 | — | — |
| Comparative component to (b) | EHPE-3150 | — | — | — | — | 20 | — |
|  | YDCN-702 | — | — | — | — | — | 20 |
| Component (c) | PERCUMYL D | 1 | 1 | 1 | 1 | 3 | 3 |
| Imidazole | 1B2PZ | — | — | — | — | 1 | 1 |
| Adhesive aid | A-1160 | 3 | 3 | 3 | 3 | 3 | 3 |
| Organic solvent | Cyclohexane | 170 | 170 | 170 | 170 | 170 | 170 |

TABLE 7

|  |  | Comparative Example 10 | Comparative Example 11 | Comparative Example 12 | Comparative Example 13 | Comparative Example 14 | Comparative Example 15 |
|---|---|---|---|---|---|---|---|
| Component (a) | (a-9) | 80 | 80 | 50 | 50 | 50 | 50 |
| Comparative component | EHPE-3150 | — | — | 50 | — | — | — |
|  | YDCN-702 | — | — | — | 50 | — | — |

TABLE 7-continued

|  |  | Comparative Example 10 | Comparative Example 11 | Comparative Example 12 | Comparative Example 13 | Comparative Example 14 | Comparative Example 15 |
|---|---|---|---|---|---|---|---|
| to (b) | BAH-100Y | 20 | — | — | — | 50 | — |
|  | LA | — | 20 | — | — | — | — |
|  | A-LEN-10 | — | — | — | — | — | 50 |
| Component (c) | PERCUMYL D | 1 | 3 | 3 | 3 | 1 | 1 |
| Imidazole | 1B2PZ | — | — | — | 1 | — | — |
| Organic solvent | Cyclohexanon | 170 | 170 | 115 | 115 | 115 | 115 |

Solutions of the adhesive compositions obtained in Examples and Comparative Examples were subjected to the following evaluations. The evaluation results are shown in Table 8 and Table 9.

(Refractive Index)

The refractive indexes of the adhesive compositions obtained in Examples 1, 5 and 6 were obtained by use of "Abbe refractometer", which is a device for obtaining a refractive index based on a critical angle. Specifically, the refractive indexes at a wavelength 589 nm (sodium D-line) were obtained in a light permeation system.

More specifically, a solution of an adhesive composition was applied onto a release PET film (FILMBYNA 38E-0010GC (trade name) manufactured by FUJIMORI KOGYO CO., LTD.) by use of an applicator and dried at 100° C./10 minutes to obtain an adhesive film having a film thickness of 100 μm. The adhesive film thus obtained was removed from the PET film and placed on a main prism of a multi-wavelength Abbe refractometer (DR-M2 (trade name), manufactured by ATAGO CO., LTD.). Refractive index was measured by use of a lighting glass at room temperature. As the buffer solution, a monobromonaphthalene solution was used.

As a result, refractive indexes of the adhesive compositions of Examples 1, 5 and 6 were 1.494, 1.489 and 1.491, respectively.

(Peel Resistance During a Reflow Process)

Solutions of the adhesive compositions obtained in Examples and Comparative Examples were each uniformly applied onto a glass substrate (MATSUNAMI MICRO COVER GLASS 40 mm×50 mm THICKNESS No. 1 (trade name), Matsunami Glass Ind., Ltd.), having a size of 4.0 cm×5.0 cm×120 to 170 μm (actually 140 to 160 μm) by use of a spin coater, and dried by a hot plate of 100° C. for 5 minutes to form an adhesive layer having a dry film thickness of 20 μm. In this manner, test substrates were prepared. To the adhesive layer of each of the test substrates, glass substrates (MATSUNAMI MICRO COVER GLASS 40 mm×50 mm THICKNESS No. 1 (trade name), Matsunami Glass Ind., Ltd.) each having a size of 4.0 cm×5.0 cm×120 to 170 μm (actually 140 to 160 μm) were bonded and cured by heating at 150° C. for 2 hours. The test substrates were allowed to stand still on a hot plate of 260° C. for 30 seconds and then returned to the environment of room temperature (25° C.) and kept there for 5 minutes. The appearance of the test substrates was visually observed and peel resistance during a reflow process was evaluated based on the following criteria:

A: No abnormal appearance was observed.
B: A peel-off was observed in part of a substrate.
C: A peel-off was observed in a whole substrate.

(Die Shear Strength at 260° C.)

In the opposite surface to the mirror surface of a silicon substrate of a 6-inch wafer having a thickness of 400 μm, an incision line of 3 mm×3 mm having a depth of 300 μm was made. Onto the surface having the incision line, a dicing sheet was bonded as a support. Solutions of the adhesive compositions of Examples and Comparative Examples were each uniformly applied onto the mirror surface of the silicon substrate having the incision line by use of a spin coater and thereafter, dried on a hot plate of 100° C. for 5 minutes to form an adhesive layer having a film thickness of 20 μm. In this manner, test substrates were prepared. The test substrate having an adhesive layer formed on the mirror surface of the silicon substrate was cleaved along the incision line to obtain 3 mm×3 mm silicon chips attached with the adhesive layer. A glass plate (MATSUNAMI MICRO COVER GLASS 100 mm×100 mm THICKNESS No. 5 (trade name), Matsunami Glass Ind., Ltd., having a thickness of 0.45 to 0.60 mm) was diced into chips of 10 mm×10 mm in size to obtain glass chips. Onto the glass chips thus obtained, the silicon chips were bonded by applying pressure of 1 N at 70° C. for 2 seconds, and cured by heating at 180° C. for 2 hours to obtain test chips. The test chips were allowed to stand still on a hot plate of 260° C. for 20 seconds or more and 1 minute or less. Thereafter, die shear strength was measured by Dage-4000 (trade name, DAGE JAPAN Co., Ltd.). Ten test chips were prepared and measurement values of the 10 test chips were averaged to obtain as the die shear strength at 260° C. The die shear strength at 260° C. was evaluated based on the following criteria:

A: 1 MPa or more.
B: 0.3 MPa or more and less than 1 MPa.
C: less than 0.3 MPa.

(Stress Relaxation)

Solutions of the adhesive compositions of Examples and Comparative Examples were each uniformly applied onto a 6-inch wafer of 400 μm by use of a spin coater on a silicon substrate and dried on a hot plate of 100° C. for 5 minutes to form an adhesive layer having a dry film thickness of 20 μm. In this manner, test substrates were prepared. The test substrates having an adhesive layer formed thereon were cured by heating at 180° C. for 2 hours. The resultant test substrates were subjected to measurement of warpage performed at room temperature (25° C.) and stress relaxation was evaluated based on the following criteria:

A: Amount of warp is 200 μm or less.
B: Amount of warp is larger than 200 μm and 500 μm or less.
C: Amount of warp is larger than 500 μm.

(Total Light Transmittance)

Samples were prepared in the same manner as in evaluation of peel resistance during a reflow process and subjected to measurement of total light transmittance using COH-300A (trade name, NIPPON DENSHOKU INDUSTRIES Co., LTD.). The total light transmittance was evaluated based on the following criteria:

A: Transmittance is 90% or more.
B: Transmittance is less than 90%.

(Tg of a Cured Product, Elastic Modulus of Cured Product at 25° C.)

Solutions of the adhesive compositions of Examples and Comparative Examples were each uniformly applied onto a release PET FILM by a knife coater and dried in the oven at 115° C. for 15 minutes to form an adhesive layer having a dry film thickness of 25 μm. Four adhesive layers thus prepared were bonded to obtain a thickness of 100 μm. The laminate was cured at 180° C. for 2 hours in the oven. The Tg of a cured product and elastic modulus thereof at 25° C. were measured by a viscoelasticity tester (RSA-III: trade name, TA Instruments. Japan). Note that measurement was performed in the conditions: test mode: tension test; test temperature: −50° C. to 300° C.; temperature raising rate: 5° C./minute; frequency: 1 Hz; distance between chucks: 20 mm.

The Tg of a cured product was evaluated based on the following criteria:
A: 0° C. or more.
B: less than 0° C.

The elastic modulus of a cured product at 25° C. was evaluated based on the following criteria:
A: 10 GPa or less and 0.01 GPa or more.
B: less than 0.01 GPa.

TABLE 8

| Example | 1 | 5 | 6 | 7 | 8 | 9 | 10 | 11 | 12 | 13 | 14 | 15 |
|---|---|---|---|---|---|---|---|---|---|---|---|---|
| Peel resistance during a reflow process | A | A | A | A | A | A | A | A | A | A | A | A |
| Die shear strength at 260° C. | A | A | A | A | B | A | B | A | A | A | A | B |
| Stress relaxation | B | B | A | A | A | A | A | A | A | A | A | A |
| Total light transmission | A | A | A | A | A | A | A | A | A | A | A | A |
| Tg of a cured product | A | A | A | A | A | A | A | A | A | A | A | A |
| Elastic modulus of a cured product at 25° C. | A | A | A | A | A | A | A | A | A | A | A | A |

TABLE 9

| Comparative Example | 4 | 5 | 6 | 7 | 8 | 9 | 10 | 11 | 12 | 13 | 14 | 15 |
|---|---|---|---|---|---|---|---|---|---|---|---|---|
| Peel resistance during a reflow process | C | C | A | A | C | C | C | C | A | A | A | C |
| Die shear strength at 260° C. | B | C | A | A | B | B | B | C | A | A | A | B |
| Stress relaxation | A | A | C | C | C | C | C | A | C | C | C | A |
| Total light transmission | A | A | B | B | A | A | A | A | A | A | A | A |
| Tg of a cured product | A | A | A | A | A | A | A | A | A | A | A | A |
| Elastic modulus of a cured product at 25° C. | B | B | A | A | A | A | A | A | A | A | A | A |

According to each evaluation results shown in Table 8 and Table 9, it was found that an adhesive composition comprising (a) an acrylic polymer having a weight-average molecular weight of 100000 or more, (b) a compound having at least two (meth)acryloyl groups and (c) a polymerization initiator, in which, the component (a) has a structural unit having a nitrogen atom-containing group in an amount of 5 mass % or less based on the whole acrylic polymer, and contains a structural unit having a functional group, exhibits an excellent effect: evaluation of peel resistance during a reflow process, die shear strength at 260° C. and stress relaxation: A or B or better, evaluation of the total light transmittance: A (Examples 1 and 5 to 15). In the present invention, if an adhesive composition has peel resistance during a reflow process, die shear strength at 260° C. and stress relaxation all evaluated as A or B as shown in Table 8 and total light transmittance evaluated as A, the composition is transparent, suppress peeling at 260° C. and has low degree of warp at room temperature (25° C.).

In the evaluation results shown in Table 9, Comparative Examples 4 and 5, in which the weight-average molecular weight of the component (a) is less than 100000, are excellent in stress relaxation; however, these Comparative Examples fail to exhibit sufficient (adhesive) performance in peel resistance during a reflow process and die shear strength at 260° C. This is because even if a sufficient curing reaction proceeds owing to components (b) and (c), since the weight-average molecular weight of the component (a) is low and further, a structural unit having the functional group is not contained in Comparative Example 5, elastic modulus at 260° C. is low, with the result that the peeling resistance and die shear strength conceivably reduce.

Comparative Examples 6 and 7 exhibit excellent peel resistance during a reflow process and excellent die shear strength at 260° C.; however, the degree of warp is large since these compositions do not comprise a component capable of relaxing stress as the component (a). Thus, these compositions are not suitably used. Furthermore, since the component (a) is a urethane acrylate oligomer containing a nitrogen atom, the result of the total light transmittance was not satisfactory.

Comparative Examples 8 to 10 employ a solid epoxy, a liquid epoxy and an epoxy-acrylate as a crosslinking component. In Comparative Examples 8 and 9, an imidazole is further added as a curing accelerator. However, presumably because phase separation of epoxy and cure shrinkage thereof were not sufficiently reduced by an acrylic polymer, the die shear strength at 260° C. was evaluated as B and the peel resistance during a reflow process was evaluated as C, with the result that peel-off occurred. In addition, white turbidity was confirmed by visual observation. Since an epoxy resin having high cohesive force and an acrylic polymer cause phase separation and they greatly differ in refractive index, the adhesive layer looks cloudy, with the result that the total light transmittance was probably evaluated as C.

Comparative Examples 12 to 14 employed a solid epoxy, a liquid epoxy and an epoxy-acrylate as crosslinking components similarly to the above and the blending proportion in amount of an acrylic polymer and a crosslinking component were changed. The peel resistance during a reflow process and die shear strength at 260° C. were improved; however, since the content of an acrylic polymer component is low, the stress relaxation was evaluated as C. In addition, white turbidity occurred. Thus, the total light transmittance was evaluated as C. These adhesive compositions were non-suitable.

Comparative Examples 11 and 15 are systems using a monofunctional acrylate. The total light transmittance and stress relaxation were satisfactory; however, the peel resistance during a reflow process and die shear strength at 260° C. were evaluated as C. They were unsuitable. In particular, when the adhesive composition of Comparative Example 11 was placed at 260° C., a large amount of gas was released and peel-off readily occurred.

As demonstrated by Examples and Comparative Examples above, the present invention can provide an adhesive composition, which can be used as a transparent adhesive for use in sensors such as a light emitter and a light receiving section and which provides a cured product having a low degree of warp and suppressed in peel-off in a reflow process at 260° C., and can provide a semiconductor device using the composition.

REFERENCE SIGNS LIST

1 . . . Solid-state imaging element, 2 . . . Silicon substrate, 3 . . . Sensor section, Light receiving section, 4 . . . Peripheral circuit, 5, 26, 32 . . . Glass substrate, 6 . . . Adhesive layer, 7 . . . Frame-like adhesive layer, 8 . . . Wiring layer, 9, 28 . . . Solder ball, 10 . . . Photodiode, 11 . . . Color filter, 12 . . . Microlens, 20 . . . Cavity, 22, 42 . . . Substrate, 24 . . . Resin layer, 34 . . . Adhesive composition, 36 . . . Support film, 38 . . . roller, 40 . . . Support base, 44 . . . Sensor, 46 . . . Weir, 48 . . . Chip.

The invention claimed is:

1. A method for manufacturing a semiconductor device comprising:
    a step of forming an adhesive layer of an adhesive composition on a semiconductor substrate, the adhesive composition comprising:
        (a) an acrylic polymer having a weight-average molecular weight of 100000 or more,
        (b) a compound having at least two (meth)acrylol groups, and
        (c) a polymerization initiator, wherein
        a structural unit having a nitrogen atom-containing group in the (a) acrylic polymer having a weight-average molecular weight of 100000 or more accounts for 5 mass % or less based on a total amount of the (a) acrylic polymer having a weight-average molecular weight of 100000 or more, and
        the (a) acrylic polymer having a weight-average molecular weight of 100000 or more has a structural unit having a functional group,
    a step of sandwiching the adhesive layer between the semiconductor substrate and a transparent substrate, and applying pressure onto the semiconductor substrate and the transparent substrate for bonding, and
    a step of curing the adhesive layer.

2. The method for manufacturing a semiconductor device according to claim 1, further comprising (d) an antioxidant.

3. The method for manufacturing a semiconductor device according to claim 1, wherein the semiconductor device is an optical part.

4. The method for manufacturing a semiconductor device according to claim 1, wherein the functional group includes an epoxy group.

5. The method for manufacturing a semiconductor device claim 4, further comprising (d) an antioxidant.

6. The method for manufacturing a semiconductor device according to claim 1, wherein the (a) acrylic polymer having a weight-average molecular weight of 100000 or more contains a structural unit having an alicyclic structure.

7. The method for manufacturing a semiconductor device according to claim 6, wherein the functional group includes an epoxy group.

8. The method for manufacturing a semiconductor device according to claim 6, further comprising (d) an antioxidant.

9. A solid-state imaging element comprising:
    a semiconductor substrate having a light receiving section provided on the upper surface,
    an adhesive layer provided on the semiconductor substrate so as to cover the light receiving section, and
    a transparent substrate bonded to the semiconductor substrate by the adhesive layer, wherein
    the adhesive layer is formed of an adhesive composition comprising:
        (a) an acrylic polymer having a weight-average molecular weight of 100000 or more,
        (b) a compound having at least two (meth)acrylol groups, and
        (c) a polymerization initiator, wherein
        a structural unit having a nitrogen atom-containing group in the (a) acrylic polymer having a weight-average molecular weight of 100000 or more accounts for 5 mass % or less based on a total amount of the (a) acrylic polymer having a weight-average molecular weight of 100000 or more, and
        the (a) acrylic polymer having a weight-average molecular weight of 100000 or more has a structural unit having a functional group.

10. The solid-state imaging element according to claim 9, further comprising (d) an antioxidant.

11. The solid-state imaging element according to claim 9, wherein the functional group includes an epoxy group.

12. The solid-state imaging element according to claim 11, further comprising (d) an antioxidant.

13. The solid-state imaging element according to claim 9, wherein the (a) acrylic polymer having a weight-average molecular weight of 100000 or more contains a structural unit having an alicyclic structure.

14. The solid-state imaging element according to claim 13, wherein the functional group includes an epoxy group.

15. The solid-state imaging element according to claim 13, further comprising (d) an antioxidant.

* * * * *